(12) United States Patent
Inomata et al.

(10) Patent No.: US 6,381,171 B1
(45) Date of Patent: Apr. 30, 2002

(54) MAGNETIC ELEMENT, MAGNETIC READ HEAD, MAGNETIC STORAGE DEVICE, MAGNETIC MEMORY DEVICE

(75) Inventors: Koichiro Inomata; Kentaro Nakajima; Yoshiaki Saito, all of Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/572,623

(22) Filed: May 17, 2000

(30) Foreign Application Priority Data

May 19, 1999 (JP) .......................................... 11-138898
Sep. 29, 1999 (JP) .......................................... 11-277458

(51) Int. Cl.[7] .............................................. G11C 11/15
(52) U.S. Cl. ...................................... 365/173; 365/171
(58) Field of Search ................................ 365/173, 171, 365/158; 257/421, 427

(56) References Cited

U.S. PATENT DOCUMENTS

| | | | | |
|---|---|---|---|---|
| 5,565,695 A | | 10/1996 | Johnson ...................... 257/295 |
| 5,654,566 A | | 8/1997 | Johnson ...................... 257/295 |
| 5,747,859 A | * | 5/1998 | Mizushima et al. ........ 257/421 |
| 5,757,056 A | | 5/1998 | Chui ............................ 257/421 |
| 5,773,156 A | | 6/1998 | Inomata et al. ............. 428/611 |
| 5,877,511 A | * | 3/1999 | Tanamoto et al. ............ 257/30 |
| 6,069,820 A | * | 5/2000 | Inomata et al. ............. 365/171 |
| 6,072,718 A | * | 6/2000 | Abraham et al. ........... 365/173 |
| 6,178,074 B1 | * | 1/2001 | Gill ........................ 360/324.2 |
| 6,201,259 B1 | * | 3/2001 | Sato et al. ..................... 257/30 |
| 6,215,696 B1 | * | 4/2001 | Tsuge .......................... 365/173 |
| 6,232,777 B1 | * | 5/2001 | Sato et al. ................... 324/252 |

OTHER PUBLICATIONS

A. Brataas[1,2,a], et al., "Non–Equilibrium Spin Accumulation in Ferromagnetic Single–Electron Transistors", The European Physical Journal B, 1999, pp. 421–430, Month unavailable.

J. Barnaś, et al., "Effects of Spin Accumulation on Single–Electron Tunneling in a Double Ferromagnetic Microjunction", Europhysics Letters, 1998, pp. 85–90, Oct. 1998.

* cited by examiner

Primary Examiner—Michael S. Lebentritt
Assistant Examiner—Anh Phung
(74) Attorney, Agent, or Firm—Oblon, Spivak, McClelland, Maier Neustadt, P.C.

(57) ABSTRACT

The present invention provides a spin-dependent tunneling effect element expectable to offer the spin accumulation effect at room temperature while also providing a data storage or "memory" element and magnetic reading head each using the tunnel effect element A first concept of the present invention lies in provision of a magnetic element characterized by comprising first and second ferromagnetic layers 1, 5 and a layer of semiconductor particles 3 neighboring the first ferromagnetic layer 1 with a first tunnel barrier 2 disposed between them and also neighboring the second ferromagnetic layer 5 with a second tunnel barrier 4 laid therebetween. A magnetic memory device is also provided which comprises a plurality of memory cells each including a spin-dependent tunneling effect element having a first ferromagnetic electrode, a second ferromagnetic electrode, and a gate electrode as inserted between the first and second ferromagnetic electrodes through first and second ferromagnetic layers; data lines connected in common to the first or second ferromagnetic electrode of multiple spin-dependent tunneling effect elements; and a plurality of word lines capacitance-coupled to the gate electrodes of different memory cells respectively, characterized in that cell selection of selecting one from among multiple memory cells as commonly connected to a data line during reading information stored therein is performed by letting one of the word lines change in potential and then changing the resistance value of a memory cell capacitance-coupled to such selected word line.

35 Claims, 15 Drawing Sheets

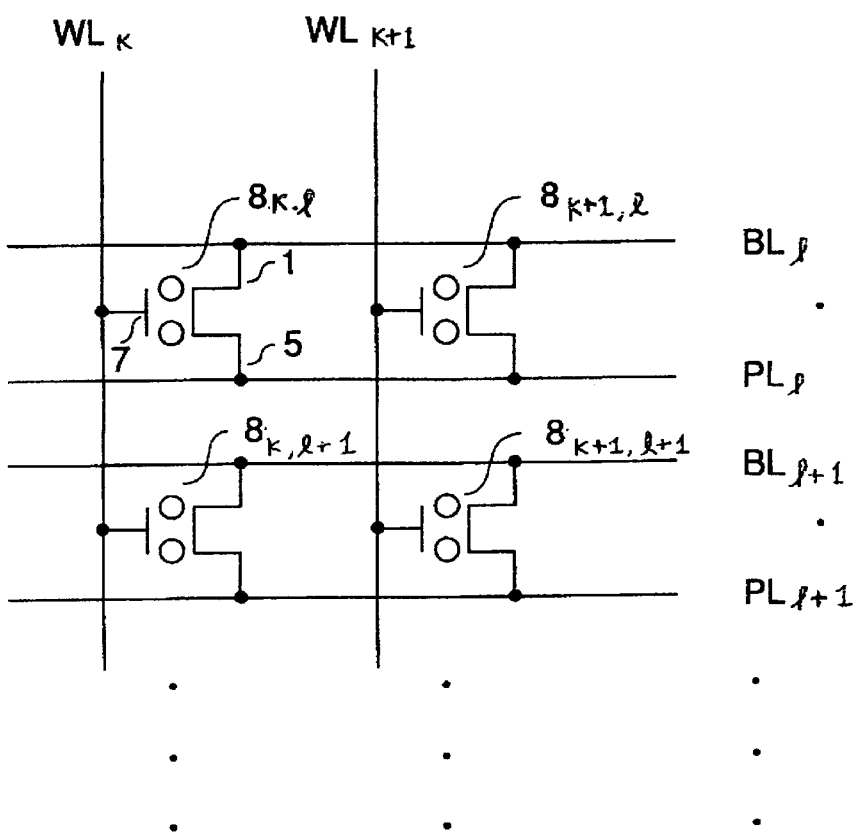

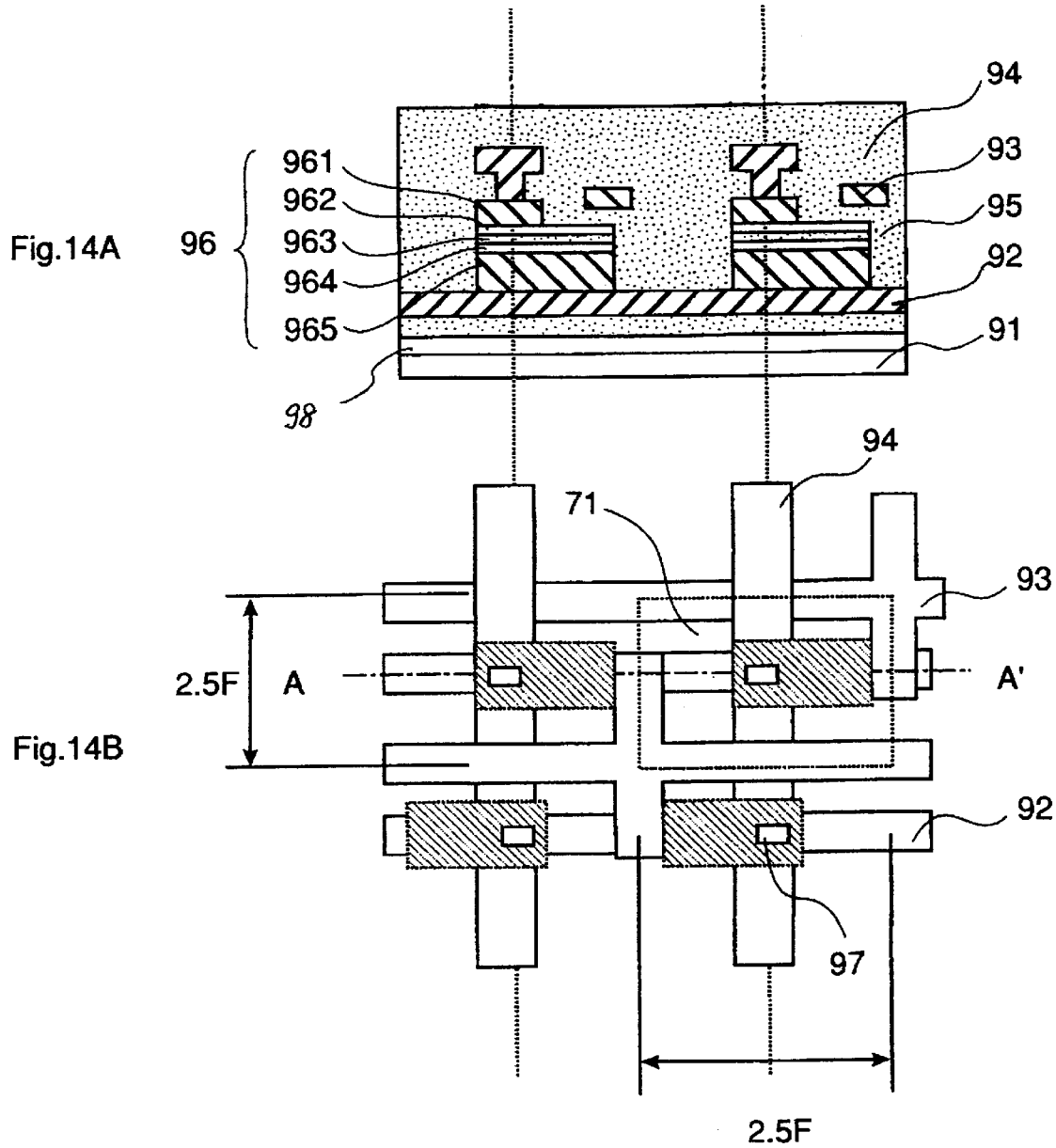

MAGNETIC ELEMENT, MAGNETIC READ HEAD, MAGNETIC STORAGE DEVICE, MAGNETIC MEMORY DEVICE

BACKGROUND OF THE INVENTION

1. Field of the Invention

The present invention relates generally to magnetic elements utilizing spin-dependent tunneling effects and also to magnetic read heads, magnetic sensor devices, magnetic storage device, and magnetic memory devices using the elements.

2. Description of the Related Art

Currently available spin-dependent transport elements utilizing magnetism include known giant magnetoresistive (GMR) elements due to spin-dependent scattering at an interface between a magnetic metal layer and a non-magnetic metal layer. This is an artificial superlattice which is structured from alternate lamination of magnetic metal layers and nonmagnetic metal layers of thicknesses on the order of magnitude of several Angstroms to several tens of Angstroms, wherein magnetic moments of opposed magnetic metal layers with a nonmagnetic layer sandwiched therebetween are coupled together in a magnetically anti-parallel state at zero externally applied magnetic field. When applying an external magnetic field to this artificial super lattice for establishment of one directional alignment of the magnetic moments of the magnetic metal layer, its resistivity decreases significantly, resulting in observation of a giant magnetoresistive effect as large as twenty to sixty percent. This advantage of such artificial superlattice does not come without accompanying penalties which follow: the requisite number of layers laminated over one another should be increased in order to obtain the significant magnetoresistive effect required; and the resulting saturated magnetic field stays significant on the order of magnitude of Tesla or greater, which serves as a serious bar to practical implementation thereof.

In recent years, a so-called "spin valve" GMR film has been developed, which is less than metallic artificial super lattices both in lamination number and in intensity of saturated magnetic field. The spin valve GMR film is designed to employ a tri-layered structure that consists of magnetic metal layers with an intervening nonmagnetic metal layer sandwiched between them. The magnetization of one of these magnetic metal layers is fixed or "pinned" in a desired direction while permitting only the remaining magnetic metal layer to invert or "switch" its magnetization upon application of an external magnetic field thereto, thereby forcing a relative angle between the magnetization directions of such two magnetic metal layers to change or vary accordingly. The tri-layered spin valve film exhibits a magnetoresistance effect of about 10% or less.

Another type of tunnel magnetoresistance (TMR) element adaptable for use as the spin-dependent transport device is known, which is based on the spin-dependent tunneling effect that is different in mechanism from spin-dependent scattering phenomena. This element includes a tri-layered structure consisting of two magnetic metal layers with an intermediate dielectric layer sandwiched therebetween, wherein one of the magnetic metal layers stacked has smaller coercive force than the other for producing a tunnel current flow upon applying of a voltage between the opposite magnetic metal layers. At this time, when inverting or switching the direction of the magnetization of the magnetic metal layer having small coercivity, spinning motion of such magnetic metal layer less in coercivity, a significant difference will be found between the value of a tunnel current obtainable when the relative orientation of the magnetizations are parallel to each other and that obtained when these are anti-parallel to each other. This large tunnel current difference leads to the capability of obtaining increased magnetoresistive effect of more than 10% at room temperature.

Ferromagnetic double tunnel junction elements are also known which have a five-layer laminated structure consisting of three—i.e. upper, intermediate, and lower—magnetic metal layers with a dielectric layer sandwiched between the upper and intermediate metal layers and also with another dielectric layer between the intermediate and lower metal layer. Some ferromagnetic double tunnel junction elements have been proposed by the inventors as named herein, which element has a multilayer structure with its intermediate ferromagnetic metal layer being constituted from a layer of fine particles made of ferromagnetic materials, as disclosed by the present inventors, *Jpn. J. Appl. Phys.*, 36 L1380 (1997), and also Japanese Patent Laid-Open No. 308313/1998. These ferromagnetic double tunnel junction elements are featured in that any possible TMR reducibility due to biassing stays less.

Several ways of applying the above-noted GMR and TMR elements to magnetic read/write heads and magnetic random access memories and the like have also been studied until today—those magnetic heads employing spin valve GMR elements have already been put to practical use.

In the context of this document, the term "magnetic random access memory (MRAM)" is defined to mean any solid-state memory device capable of randomly rewriting information to be recorded andalso storing and reading same by utilization of magnetization directions of ferromagnetic materials as information carrier. Typically an MRAM is configured from an array of memory cells each having a ferromagnetic thin film, nonmagnetic thin film, dielectric film or a multilayer structure thereof, and driver circuitry operatively associated with the memory cells via a plurality of electrical leads including read/write signal transmission lines connected thereto.

Recording data into MRAMs may be performed by causing the magnetization direction of a ferromagnetic material making up a memory cell to invert or "switch" in response to a current magnetic field occurring due to a current flow in a write line coupled thereto, and then determining whether the switched magnetization direction is parallel or antiparallel to a prespecified reference direction in a way such that the former case corresponds to a binary data bit of logical value "1" whereas the latter corresponds to a data bit of "0." In MRAMs, electrical power consumption is principally zero during storing data once written thereinto, which permits MRAMs to function as nonvolatile memory devices capable of retaining information for an extended time period even when power is removed.

On the other hand, reading data recorded in MRAMs is carried out by utilization of a specific phenomenon that the memory cell's electrical resistivity is variable depending upon either a relative angle between the magnetization direction of a ferromagnetic material constituting a cell and a sense current or, alternatively, a relative angle between the magnetization directions of a plurality of ferromagnetic layers. This phenomenon is called the magnetoresistive (MR) effect among those skilled in the art to which the invention pertains. Known magnetoresistive effect is an anisotropic magnetoresistive (AMR) effect in which an electrical resistance varies in value depending on whether a relative angle between a current and magnetization is parallel or vertical to each other. Other MR effects are also known, including giant magnetoresistive (GMR) effect and tunnel magnetoresistive (TMR) effect, wherein the former is such that electrical resistivity varies depending on whether magnetizations of multiple ferromagnetic layers with a non-magnetic conductor sandwiched therebetween are parallel or antiparallel in alignment to each other, whereas the latter is that tunnel resistivity varies depending on whether magnetization of a plurality of ferromagnetic layers with an electrically insulative material sandwiched therebetween are parallel or antiparallel in alignment direction to each other.

With prior known memory cells exhibiting the AMR and GMR effects (referred to hereinafter as "AMR cell" and "GMR" cell respectively), the direction of a sense current flow typically stays parallel to the film surface of a ferromagnetic material used. Almost all of currently employed materials exhibiting the AMR and GMR effects are good conductive, the sheet resistivity of which has values within a range of approximately a few to several tens of $\Omega/\mu m_2$. Accordingly, assuming that the resistance value of a memory cell is about 100 $\Omega$ while letting the magnetoresistance ratio be about 5% and also letting the minimum detection sensitivity of a sense amplifier connected to the memory cell be about 50 mV, a sense current of about 10 mA should be required in order to obtain a necessary cell output voltage. In presently commercially available metal oxide semiconductor field effect transistors (MOSFETs), a source-drain current $I_S$ is proportional in value to ratio of channel width W to channel length L (W/L) One example is that when W is about 3.3 $\mu$m and L is about 1 $\mu$m, the value of $I_S$ is nearly equal to 0.1 mA. Thus, the sense current value of about 10 mA is extremely excessive relative to those transistors as manufactured to have their minimum feature size satisfying the so-called sub micron rules in modern semiconductor microfabrication technologies.

One possible approach to avoiding this problem is to design MRAM cells using the AMR or GMR effect so that a plurality of AMR/GMR cells are serially coupled together to thereby constitute a data line, as has been disclosed in IEEE Trans Comp. Pac Manu. Tech. pt. A, 17, 373 (1994). An advantage of this approach lies in an ability to increase the area of a transistor while at the same time increasing its channel width without having to increase a cell area per se because of the fact that multiple memory cells are designed to commonly share a single data line-driving transistor. For instance, it is taught by the above-identified citation that eight separate memory cells are connected in series with one another while employing a transistor with W/L of about 50/1, permitting supplement of a sense current of about 2.5 mA.

The use of such serial combination of memory cells is encountered with a problem that the resultant power consuming efficiency greatly decreases. More specifically, with the technique taught by the above document, the consumption efficiency $\eta$/during reading data out of a certain memory cell is given as $\eta=1/8=0.125$. Such less power consumption efficiency serves as a serious bar to the applicability to portable or "handheld" electronic instruments including mobile personal computers (PCs) under strict requirements as to low power consumption.

To avoid these problems, it has been proposed that the TMR effect is applied in place of the AMR/GMR effects. Amemory cell exhibiting the TMR effect (referred to as "TMR cells" hereafter) is typically arranged to include a tri-layered laminated structure consisting essentially of first and second ferromagnetic layers with an electrically insulative layer sandwiched between them, wherein a current flows so that it "tunnels" through the insulative layer. A tunnel resistance value varies in a way proportional to the cosine of a relative angle between magnetization directions of the two ferromagnetic layers made of metals in such a manner that the resistance value is at its maximal level when these magnetizations are antiparallel in direction to each other. One example is disclosed in IEEE Trans. Mag., 33, 3553 (1997), wherein an increased magnetoresistance ratio was observed to be in excess of about 25% in the presence of a low magnetic field of about 50 Oe or less in the case of an NiFe/Co/Al$_2$O$_3$/Co/NiFe tunnel junction. The magnetoresistance ratio based on the TMR effect is proportional to a product of spin polarization rates $P_1$, $P_2$ of the first and second ferromagnetic layers. For example, the use of specific materials with spin polarization of 100% such as half-metals makes it possible to obtain magnetoresistance ratio of about 50% or greater. Also note that TMR cells are capable of obtaining high resistance values in comparison with AMR cells and GMR cells. A typical cell resistance value is about $10^4$ to $10^6 \Omega$ per junction area ($\mu m^2$). Accordingly, assuming that the resistance value of a cell with area of about 1 $\mu m^2$ is about 10 k$\Omega$ and its magnetoresistance ratio is about 50%, a cell read signal of about 50 mV is obtainable when a sense current is about 10 $\mu$A.

With TMR cells a sense current is expected to flow in a direction perpendicular to the surface of a ferromagnetic filmused. This suggests that it remains difficult to serially connect such cells together and that its cell layout is noticeably different from that of AMR and GMR cells. Most MRAMs using TMR cells are thus arranged so that these TMR cells are connected in parallel with one another. A detailed configuration thereof is such that a plurality of TMR elements are laid out into a matrix form while also employing select transistors operatively associated therewith. The select transistors may be designed in one of some proposed ways which follow: (1) select transistors are provided at respective TMR cells; (2) select transistors are disposed in units of data lines; and (3) select transistors are in units of row data lines and column data lines (for detail see J. Appl. Phys., 81, 3758 (1997)). These configurations proposed have advantages and disadvantages respectively.

The scheme (1) above is such that the resulting power consumption efficiency $\eta$ stays high during reading due to the presence of a select transistor disposed at the individual cell. However, this advantage does not come without accompanying a penalty as to the difficulty of cell area reduction due to the fact that a transistor is disposed at each cell. For instance, letting the data line width be represented by "F," the cell area is expected through calculation to fall within a range whose upper limit is at or near $12F^2$, which permits a skilled person to consider that a shrinkage limit of cell area in this scheme is substantially the same as that of DRAMs, i.e. $8F^2$ or more or less. On the contrary, the schemes (2) and (3) are such that an estimated cell area falls within a range of about $6F^2$ to $9F^2$ in view of the fact that any select transistor is no longer required for the individual cell. With this scheme, the cell area shrink limit is obtained when row data lines and column data lines are disposed with a distance F defined between adjacent ones of them, whose value is at about $4F^2$. This value makes it expectable to achieve increased integration densities as compared to the scheme (1). However, with this scheme, a sense current behaves to partly flow into more than one of the other cells coupled to the same data line. Letting the number of cells coupled to a data line be given as N, a "virtual" resistance value as looked at from a data line driving transistor is 1/N of the resistance value of a single cell; thus, it becomes difficult to reduce or suppress a sense current, which in turn causes the power consumption efficiency η to greatly decrease when compared to that in the scheme (1). In addition, as a signal as output to a sense amplifier is 1/N of a cell output signal, the resultant signal-to-noise ratio during reading decreases when compared to that of (1). An only way of solving this is to increase a read time period of the sense amplifier, which would result in lack of high-speed read performance.

Improved device structures free from the disadvantages of the schemes (2) and (3) have been disclosed, for example, in U.S. Pat. Nos. 5,640,343 and 5,838,608, which are designed to employ the structure of the scheme (3) while additionally providing a semiconductor diode as serially coupled to each TMR element used. In this structure, either a pn-junction diode or Schottky diode is connected to a TMR element, wherein the TMR element is coupled to one column data line whereas the diode is to a row data line. The diode is disposed in the forward direction relative to the direction of a sense current flow, thereby attaining cell selectability through control of are rative relation of aforward directional potential drop at the diode versus a potential difference between the column data line and row data line.

In MRAM circuitry using related art TMR elements is such that any critical voltage is absent, which permits a tunnel current to readily flow upon mere application of a low voltage if a storage element is laid out directly at part between a corresponding bit line and its associated plate. To prevent such current flow, it is a must to provide an additional or "extra" semiconductor element or else for use as a switching element. Obviously the addition of such switching FET can greatly affect the cell area reduction required; in the worst case, the result becomes contrary to the quest for higher integration densities in data storage elements.

In recent years, many studies are directed to the theoretical investigation of a spin accumulation effect occurring at double tunnel junctions using metallic powdery grains or particles, one of which has been disclosed in J. Barns et al., *Phys. Rev. Lett.*, 80, 1058 (1998). This spin accumulation effect will be explained in brief below.

Consider a double tunnel junction structure consisting essentially of alternating films of different materials—namely, upper and lower ferromagnetic electrodes with a layer of nonmagnetic metal particles sandwiched therebetween, the electrodes and metal particle layer being electrically isolated from each other by intervening dielectric layers, one of which is between the upper electrode and the metal layer and the other of which is between this layer and the lower electrode. When the thickness of the dielectric layer is sufficiently thin a spin-polarized tunnel electron or electrons can flow upon applying of a voltage between the two ferromagnetic electrodes. Imagine that the nonmagnetic metal particles used are small in size enough to allow single electron charging effects to take place, and simultaneously two tunnel barriers (the opposite dielectric layers) are asymmetrical in conductance with each other. If this is the case, spin-polarized tunnel electrons are accumulated within the nonmagnetic metal particles in no equilibrium fashion, causing the nonmagnetic metal particles' chemical potential $\Delta\mu$ to shift or offset in value in a way depending on spin states, which leads to creation of no equilibristic spin polarization. As a result, it will be expected that the TMR effect appear. It has been pointed out that the ratio is variable depending on a spin relaxation time and/or dimensions of metal particles, and that if the spin relaxation time within the nonmagnetic metal particles is sufficiently long then the TMR effect may be given by $P^2$ in maximum, where P is the spin polarization of conduction electrons of ferromagnetic electrodes used, as suggested by A. Brataas et al., *Phys. Rev.*, B59, 93 (1998).

Related art spin-dependent transport elements include GMR elements and TMR elements, which in turn include double tunnel junction elements using nonmagnetic metal particles. It is known among those skilled in the art that with such double tunnel junction elements, increased tunnel magnetoresistivity is theoretically expected to be obtainable owing to the spin accumulation effect, which resistivity is as large in maximal value as the squared of a spin polarization ratio of ferromagnetic electrodes.

On the other hand, although it is desirable for applying TMR elements to memory cells to dispose these TMR cells in the form of a matrix while letting a single data line driver transistor be commonly shared by a plurality of cells, this approach is faced with a problem as to the difficulty in connecting the cells into a serial combination because of the fact that TMR cells are inherently designed so that a sense current flows in a vertical direction relative to elements. And highly integrated memory device structures using currently proposed TMR cells suffer from a decrease in efficiency of consumed power and an output signal due to unwanted divergent flow of a sense current as resulted from the use of a parallel connection of cells with respect to a data line, and further from an increase in read time due to the incapability of obtaining any sufficient signal-to-noise ratios.

SUMMARY OF THE INVENTION

It is therefore an object of the present invention to provide a new and improved magnetic element expected to offer high spin accumulation effect in comparison with double tunnel junction elements using related art nonmagnetic metal fine particles, or alternatively provide a magnetic element with the spin accumulation effect obtainable at room temperature along with a memory device and a magnetic read head plus a magnetic disk element each employing these magnetic elements.

It is another object of the invention is to provide a magnetic memory device high in density and low in power consumption.

A first aspect of the present invention is directed to providing a magnetic device which comprises first and second ferromagnetic layers, and a layer of semiconductor particles neighboring the first ferromagnetic layer with a first tunnel barrier lying therebetween and also neighboring the second ferromagnetic layer with a second tunnel barrier laid therebetween, wherein the second tunnel barrier is different in conductance from the first tunnel barrier.

In accordance with a second aspect of this invention, a magnetic element is provided which comprises a ferromagnetic electrode, a non magnetic electrode, and a layer of ferromagnetic semiconductor particles neighboring the ferromagnetic electrode with a first tunnel barrier laid therebetween while neighboring the nonmagnetic electrode with a second tunnel barrier therebetween, wherein the second tunnel barrier is different in conductance from the first tunnel barrier.

The first and second inventive teachings are related to specific magnetic elements of the spin-dependent tunnel effect as expected to offer higher spin accumulation effect by use of island-like nonmagnetic or ferromagnetic semiconductor or fine particles surrounded by dielectric layers, while also relating to application of the same to data storage or "memory" devices and magnetic disk elements. The fine particles may have representative dimension on the order of nano meters. Each of the fine particles may have several different cross sectional shapes, such as spherical, oval, and others.

To enable observation of the intended spin accumulation effect in those particles sandwiched between two tunnel barriers, the following criteria must be met: i) operation temperatures are lower than the charging energy $E_c$, of the semiconductor fine particles; and ii) the spin relaxation time $\tau_{sf}$ of tunneling electrons in the fine particles is longer than the tunneling time. The latter criterion ii) requires establishment of $$\tau_{sf} > RC, \qquad (1)$$

where R is the electrical resistivity of a junction, C is the capacitance thereof, and thus RC defines the tunneling time. On the other hand, the charging energy $E_c$ of the former criterion i) at an extra-small or "micro" tunnel junction may be given as $$E_c = e^2/2C, \qquad (2)$$

where "e" is the electrical charge of an electron, and C is the capacitance of the junction. From Equations (1) and (2), it would be appreciated that a specific relation must be established as follows:

$$\tau_{sf} > R \times (e^2/2Ec). \qquad (3)$$

As $\tau_{sf}$ is determinable by selection of a material used, Formula (3) requires that $E_c$, must be large in value.

Generally the spin relaxation time in semiconductor is long, and the number of electrons residing in such semiconductor fine particles is extremely smaller than the number of electrons in metals of the same size. Consequently, the charging energy $E_c$ is large, which permits relatively easy satisfaction of Formula (3). This in turn makes it possible to achieve observation of the intended spin accumulation effect even at room temperature.

Further, in the semiconductor fine particles, the discrete energy level due to the quantum confinement effect may be observed. δ between discrete energy levels as defined by the quantum theory therein. The chemical potential shift $\Delta\mu$ is proportional to the energy level separation δ, leading to a capability to increase the resulting TMR effect. When employing a ferromagnetic semiconductor material as the fine particle, TMR is given by $2P^2$. The TMR in this case increases so that it is two times greater than that in the case of nonmagnetic metal particles, which is further preferable.

The above-noted junction using the semiconductor fine particles should not be limited only to double tunnel junction structures and may also be applicable to treble or more complicated tunnel junctions, wherein the same or better TMR results are obtainable by employing similar structures thereto.

In case spin-dependent tunnelling elements using the semiconductor fine particles noted above are applied to electronic parts or components such as for example data storage or "memory" elements, any additional transistors for use in selecting a desired element are no longer required, thus enabling provision of superior nonvolatile memory elements high in integration density and yet low in power consumption.

In contrast to the first and second inventions discussed above, in case that fine particles are used in the double tunnel junction structure with the multilayer structure consisting of ferromagnetic layer (electrode)/insulating layer/nonmagnetic metal particles/insulating layer/ferromagnetic layer (electrode), as has been explained in the introductory part of the description, the number of conduction electrons per unit volume is larger whereby the discrete energy levels separation δ due to the quantum confinement effect stays less so that the shift $\Delta\mu$ of chemical potential is small, which in turn makes it hardly expectable to achieve any intended large spin accumulation effect. Additionally, while environmental temperatures must be lower than the charging energy $E_C$ of fine particles used, any required spin accumulation effect will no longer be expectable. In the case of metal fine particles, size of the particle on the order of sub-nanometers is required for this criterion. Accordingly, in case such spin-dependent tunneling elements using the spin accumulation effect are applied to memory elements or the like, it is inevitable to employ extra transistors for use in selection of individual elements.

The first and second concepts of the inventions stated supra are adaptable for use in magnetic read heads, magnetic sensors, magnetic memory devices or any possible equivalents thereto.

In accordance with a third aspect of the instant invention, a magnetic memory device is provided which comprises: a plurality of memory cells including spin-dependent tunneling effect elements each having a first ferromagnetic electrode, a second ferromagnetic electrode, and a gate electrode as inserted between the first and second ferromagnetic electrodes with first and second dielectric layers laid between the electrodes and the gate electrode; data lines including a data line connected in common to the first or second ferromagnetic electrodes of the spin-dependent tunnel effect elements; and a plurality of word lines capacitively coupled to the gate electrodes of the memory cells different from one another, wherein cell selection of selecting one from among the plurality of memory cells as commonly connected to the data line during reading information stored therein is performed by selecting one of the word lines to cause the selected word line to change in voltage, and then letting more than one memory cell capacitance-coupled to the selected word line change in electrical resistance value.

With the third invention, the word lines may be arranged to cross over the data lines.

In addition, with the third invention, the first ferromagnetic electrode, first dielectric layer, gate electrode, second dielectric layer and second ferromagnetic electrode are laminated in this order of sequence, wherein the second dielectric layer includes a first region with the second ferromagnetic electrode formed therein and a second region with the second ferromagnetic layer being absent therein, and wherein the word line is laid out along the second region of the plurality of memory cells.

With the third invention, the spin-dependent tunneling effect element exhibits two different tunnel resistance values through voltage variation of the word line, wherein a specified one of these values is at least one thousand times greater than the remaining one thereof.

In addition, with the third invention, the gate electrode may be a granular magnetic film having ferromagnetic fine particles with coercivity as dispersed within a dielectric matrix.

Additionally, with the third invention, the gate electrode may be a granular film having nonmagnetic particles or semiconductor particles as dispersed in a dielectric matrix, wherein a spin relaxation time of either the nonmagnetic particles or the semiconductive particles is longer than a tunnel time as taken to complete tunneling from the first or second ferromagnetic electrode through the dielectric layer up to the gate electrode.

Furthermore, with the third invention, the gate electrode may be metal or semiconductor fine particles with a quantum resonance energy level.

BRIEF DESCRIPTION OF THE DRAWINGS

A more complete appreciation of the invention and many of the attendant advantages thereof is readily obtained as the same becomes better understoodby reference to the following detailed description when considered in connection with the accompanying drawings.

FIG. 3 is a circuit diagram for explanation of a memory device in accordance with a third preferred form of the invention;

FIGS. 14A and 14B are respectively a sectional diagram and plan view diagram pictorially depicting a magnetic memory device in accordance with a fourth embodiment of the invention;

DESCRIPTION OF THE PREFERRED EMBODIMENTS

In various aspects, the present invention relates to a spin dependent conduction device, which has high MR amplitude.

(First Form)

An explanation will first be given of a spin-dependent resonant tunneling effect in the case of using semiconductor fine particles, which constitutes the basic concept of the present invention. Although a double tunnel junction structure using nonmagnetic semiconductor particles will be discussed therein, it would be readily appreciated by those skilled in the art that similar results are obtainable when the inventive principles are applied to other tunnel junction structures including, but not limited to, treble or more complicated tunneling structures and also those employing ferromagnetic semiconductor particles used therein.

Figure 1A:
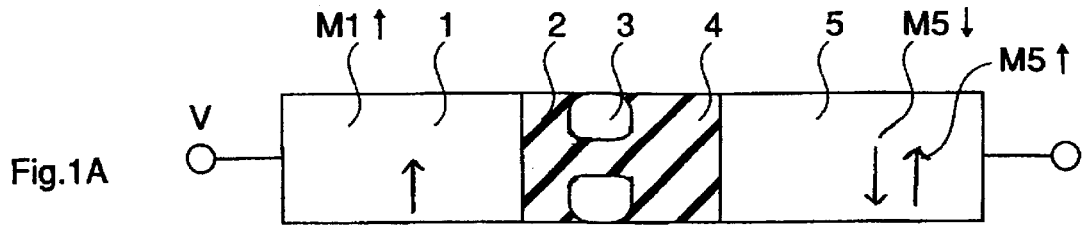
FIGS. 1A, 1B and 1C are diagrams schematically showing a cross-sectional view of a double tunnel junction element in accordance with a first preferred form of the present invention, and an energy potential diagram for explanation of a spin accumulation effect thereof, and a modification of the element shown in FIG. 1A, respectively.

Referring first to FIG. 1A, there is shown in cross-section a conceptual basic structure of a double tunneling junction element embodying the invention. As shown herein, this double tunnel junction element includes a multilayer structure that consists essentially of a ferromagnetic layer 1, a thin dielectric layer 2, a layer of nonmagnetic semiconductor fine particles 3, a thin dielectric layer 4, and a ferromagnetic layer 5 in this order of sequence. The ferromagnetic layers 1 and 5 are a pair of electrodes for receiving a voltage V as externally applied therebetween. The ferromagnetic layer 1 is capable of having magnetization "M1↑" as indicated by an arrow in FIG. 1A whereas the ferromagnetic layer 5 is capable of having either one of $M_5\uparrow$ and $M_5\downarrow$ inverted. Provided between these ferromagnetic layers 1 and 5 are the thin dielectric layers 2 and 4 along with nonmagnetic semiconductor particles 3 as sandwiched between the dielectric layers 2 and 4. These dielectric layers 2 and 4 are designed to differ in thickness from each other, in order to let them exhibit asymmetry in tunnel conductance. In this double tunnel junction element the magnetization $M_1$ of the ferromagnetic layer 1 is fixed or "pinned" in place to the ↑ direction while setting the magnetization $M_5$ of the ferromagnetic layer 5 be identical to any one of ↑ and ↓, thereby enabling interrelated magnetizations to be parallel or anti-parallel to each other. The amount of a tunnel current flowing through the double tunnel junction in the state that related magnetizations are parallel to each other is greater than the tunnel current amount in the antiparallel state. The greater a difference between such parallel state current amount and antiparallel state current amount, the greater the resultant magnetoresistance ratio. Note that in order to fix the magnetization of the ferromagnetic layer 1 while making free the magnetization of the ferromagnetic layer 5, the coercive force of ferromagnetic layer 1 may be set to be greater than that of ferromagnetic layer 5. Practically, an anti-ferromagnetic film is disposed adjacent to the ferromagnetic layer 1, thereby increasing the coercivity of ferromagnetic layer 1 by exchange coupling forces. An alternative way of attaining the same is to make the ferromagnetic layers 1 and 5 different in material from each other.

Figure 1B:
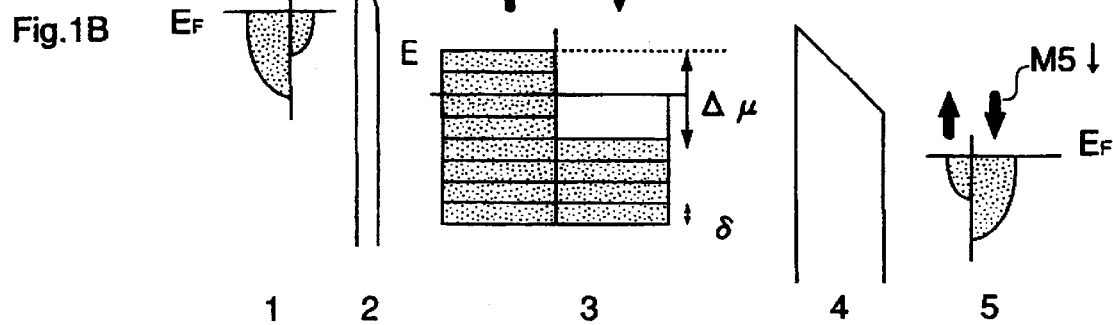
Figure 1C:
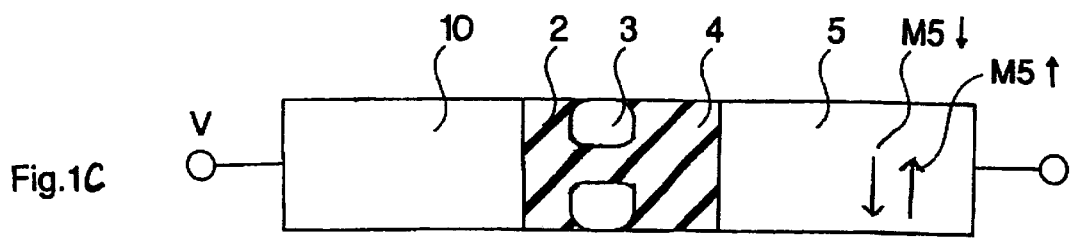

A modification of the device of FIG. 1A is shown in FIG. 1C. Layer 10 is an electrode that forms a tunnel barrier with layer 2. Here, layer 10 is a nonmagnetic material. The conductance of this tunnel barrier is different from the tunnel barrier between layers 4 and 5.

An explanation will next be given of a spin accumulation effect in the structure shown in FIG. 1A. Assuming that the semiconductor fine particles 3 are sufficiently small in diameter, several discrete energy levels $E_m$ (n=1, 2, 3 . . . n) are formed by quantum confinement effect as shown in the energy potential concept diagram of FIG. 1B. Here, a separation δ of these discrete energy levels $E_m$ is inversely proportional to the number of those electrons contained in the fine particles; thus, it is possible to achieve the intended controllability thereof through appropriate adjustment of the diameters of fine particles. In summary, the smaller the particle diameter, the greater the separation δ.

The charging energy of semiconductor fine particles is large. The spin relaxation time is sufficiently longer than the tunneling time. The expected spin relaxation time in semiconductors is longer than that in metals. In view of these facts, it will be able to easily fabricate the intended tunnel junction structure with the spin accumulation effect.

In such tunnel junction structure, when applying a voltage V between the ferromagnetic layers 1, 5, certain electrons behave to tunnel which have spin-polarized between the ferromagnetic layer 1 and semiconductor particles 3 via the dielectric layer 2 of FIG. 1B. While these tunnel electrons attempt to tunnel through the next neighboring dielectric layer 4, tunneled spin-polarized electrons will be accumulated in the semiconductor fine particles 3 within a spin relaxation time period because of the fact that as shown in FIG. 1B the tunnel junctions 2 and 4 are designed to have asymmetry as a result of making the dielectric layer 2 smaller in thickness than the dielectric layer 4 while simultaneously taking into consideration that the spin relaxation time of tunnel electrons in semiconductor is longer than a time taken to tunnel through the dielectric layer 2. In the semiconductor particles 3 of FIG. 1B, spin-polarized electrons in the ↑ direction become greater in number than those in the ↓ direction. This would result in that chemical potential shift Δμ=(excess electrons s×discrete energy level separation δ) takes place causing the semiconductor particles to be spin-polarized in the ↑ direction. In other words the semiconductor fine particles 3 are expected to have magnetization in virtually the same direction as $M_1$↑. Since these spin-polarized electrons behave to tunnel from the semiconductor fine particles 3 through the dielectric layer 4 toward the ferromagnetic layer 5, the TMR effect will occur in the device structure irrespective of the fact that the semiconductor material used is nonmagnetic in nature. More specifically, as shown in FIG. 1A, letting the magnetization of one of the two ferromagnetic layers, i.e. ferromagnetic layer 1, be fixed or "pinned" in place at $M_1$↑ while forcing the remaining ferromagnetic layer 5 to switch in magnetization makes it possible to permit the magnetization directions of both ferromagnetic layers 1, 5 to be in the relation of the parallel state $M_5$↑ or alternatively antiparallel state $M_1$↓, which in turn enables accomplishment of the intended TMR effect based on a change in resistivity change in the both states. The TMR ratio thereof may be given by $P^2$ in maximum, where P is the spin polarization ratio of magnetic material as stated previously. In view of the fact that semiconductors typically have a large discrete energy level separation δ and also a long spin relaxation time, the intended TMR ratio at or near the maximum value $P^2$ is readily obtainable when compared to metal fine particles; noticeably, such TMR ratio is obtained even at room temperature. This is one of the principal features unique to the invention in the case of using semiconductor materials.

(Second Form)

An explanation will be given of a second preferred form of the invention, which relates to a three-terminal tunnel magnetoresistive (TMR) element with a gate electrode being added to the double tunnel junction element as has been set forth in the first form of the invention.

Figure 2A:
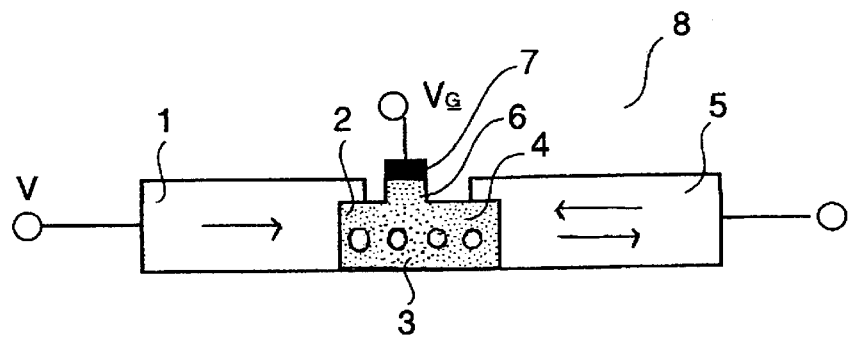
FIGS. 2A, 2B and 2C are a schematical cross sectional diagram of three-terminal TMR element providing a gate electrode at a double tunnel junction in accordance with a second preferred form of this invention along with energy potential diagrams for explanation of an operation thereof.
Figure 2B:
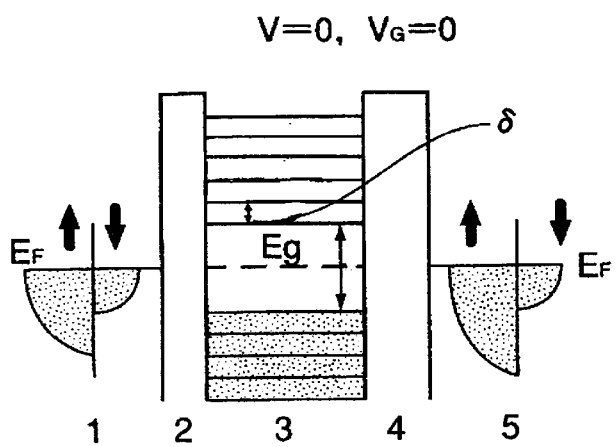

As shown in a sectional view of FIG. 2A, the TMR element is arranged so that a gate electrode 7 is added to the layer of semiconductor fine particles 3 of the double tunnel junction element in accordance with the first form of the invention shown in FIG. 1A, wherein the gate electrode 7 is provided over the semiconductor fine particles 3 with a dielectric layer 6 laid therebetween. This gate electrode 7 is designed to receive a control voltage $V_G$, which is used to control the electrostatic potential in semiconductor fine particles 3 with respect to the Fermi level $E_F$ of ferromagnetic layers 1 and 5 to thereby control creation of the intended spin accumulation effect. Generally, in the state that zero voltage V (V=0) is applied between the ferromagnetic layers 1 and 5, the Fermi level $E_F$ of ferromagnetic layers 1 and 5 resides within a band gap $E_g$ of semiconductor material as shown in the energy potential diagram of FIG. 2B.

In case the Fermi level $E_F$ of ferromagnetic layers 1 and 5 is still present within the semiconductor band gap $E_g$, no tunnel currents flow even upon applying of a weak voltage $V=V_0$ between ferromagnetic layers 1, 5. On the contrary, when applying a gate voltage $V_G$ and then potentially increasing this voltage up to a critical value $V_G=V_C$ which allows the bottom of a conduction band $V_B$ of the semiconductor to be identical with the Fermi level of its associative ferromagnetic layer, a spin-polarized current rushes to flow between the ferromagnetic layer 1 and semiconductor particles 3 through thin dielectric layer 2. When tunneled spin-polarized electrons are accumulated or stored in such semiconductor particles 3, these semiconductor particles 3 behave to virtually have magnetization in the way as previously discussed in conjunction with the first practicing form of the invention; consequently, measuring such tunnel current flowing between ferromagnetic layers 1 and 5 makes it possible to detect which one of them is greater than the other to thereby determine whether the magnetization directions of ferromagnetic layers 1 and 5 are parallel or antiparallel in direction to each other. To be brief, when compared to the parallel state of the magnetization directions of ferromagnetic layers 1 and 5, the antiparallel state is such that the current amount is lowered, which makes it possible to detect the exact magnetization state through measurement of a current value difference therebetween. In this way, any tunnel current hardly flows when $V_G$ is less than or equal to the critical voltage $V_C$, and a spin-polarized tunnel current begins flowing only when $V_G$ is greater than $V_C$—this is a second important feature of the TMR element embodying the invention, which employs the semiconductor particles rather than metal particles. $V_G$ maybe equivalent to a gate voltage in field effect transistors (FETS) using semiconductor materials whereas the tunnel current equals to a source-drain current therein. One noticeable difference from FETs is that the tunnel current is a spin-polarized current, wherein the direction of relative spin direction is detectable depending on the significance of such current.

(Third Form)

An explanation will next be given of a memory device that employs the three-terminal MR element as set forth in the second mode carrying out the invention discussed above.

See FIG. 3. This diagram depicts a configuration of circuitry of the memory device employing the above-noted three-terminal TMR element as a single memory cell. Each three-terminal TMR element 8 has its gate electrode 7 connected to a corresponding one of wordlines WL and also has ferromagnetic layers 1 and 5 connected to a bit line BL and plate electrode line PL respectively, these lines constituting a pair More specifically, one of three-terminal elements, e.g 3-terminal cell $8_{k1}$, is designed to have its gate electrode 7 connected to a word line $WL_k$ and ferromagnetic layers 1, 5 connected to $BL_1$, $PL_1$, respectively. Here, the word lines WL are an array of parallel signal transmission lines extending in the column direction whereas the paired bit lines BL and plate electrode lines PL are parallel lines extending in the row direction to cross over the word lines WL thus providing cross points or "intersections" therebetween. The 3-terminal cells 8 are disposed at these intersections between respective word lines WL and bit line BL/plate electrode line PL pairs, thereby providing a highly integrated data storage device with an array of rows and columns of memory cells As previously stated in conjunction with the second practicing form, the critical voltage $V_G=V_C$ exists in the individual 3-terminal cell 8 so that mere application of a voltage between its associated bit line and plate does not result in any tunnel current flowing therein. To cause the intended current to flow, a specified voltage that is potentially higher than or equal to $V_C$ may be applied to the gate electrode 7. With such gate voltage application, sufficiently high TMR effect is obtainable. This may eliminate a need for additional transistors employed as switching semiconductor elements in related art memory cells, which in turn makes it possible to further increase the integration density of the memory device while at the same time reducing power consumption. It should be noted here that the memory cells of FIG. 3 are modifiable so that each of them is replaced with the 2-terminal TMR element shown in FIG. 1. In such case the ferromagnetic layers 1 and 5 of each cell are arranged so that one of them is connected to a bit line whereas the other is to a word line.

The semiconductor particles of the present invention are such that these are surrounded by a ferromagnetic layer from a tunnel barrier between neighboring electrodes with a dielectric layer sandwiched therebetween. Also note that the semiconductor particles should not exclusively be limited to spherical grains and may be replaced with island-shaped components as artificially fabricated by microfabrication techniques. Still alternatively the particles maybe designed to have a specific structure with two-dimensional electron gases confined by semiconductor heterostructures, which have been widely studied by experts in the semiconductor art.

Semiconductor materials preferably used in the device embodying the invention include silicon (Si), germanium (Ge), and alloys thereof, and also include compound semiconductor materials such as for example GaAs, InGaP, GaN, InGaAlAs and equivalents thereto. Other semiconductive materials could of course be used with equal results, including but not limited to narrow-gap semiconductors such as FeSi or else. Additionally these semiconductors may contain therein those impurities used to control energy gaps.

Preferred materials forming the intended tunnel junction barrier may be a variety of kinds of dielectric materials including, but not limited to, $Al_2O_3$, $Ta_2O_5$, $HfO_2$, $SiO_2$, MgO, $MgF_2$, $Bi_2O_3$, AlN, $CaF_2$ or other similar suitable materials. It must be noted that although these oxide films and nitride films plus fluoride films inherently come with defects of respective constituent elements, such defects are generally negligible as long as they have enhanced tunnel barrier effects.

The ferromagnetic layers 1, 5 may be made of various kinds of magnetic materials, including Fe-Ni alloys such as permalloy; Fe, Co, Ni and their alloys with ferromagnetism; Heusler alloy-based half-metals such as for example NiMnsb, PtMnSb, $Co_2MnGe$ or the like; oxide-based half metals such as $CrO_2$, magnetite, Mn-perovskite or else; and amorphous alloys. Half metals are such that the presence of an energy band at one of spin bands causes a limited number of electrons with on-directional spins to be devoted to electrical conduction; thus, use of such half metals makes it possible to obtain enhanced magnetoresistivity.

It will be preferable that each ferromagnetic layer have one-axis magnetic anisotropy within its film surface. This enables creation of rapid magnetization inversion or magnetic flux reversalwhile simultaneously permitting once-established magnetization state to retain with increased stability. When the need arises, additional layers may also be provided including an underlayer made of either magnetic materials or nonmagnetic ones with or without the use of a nonmagnetic overcoat layer, thereby to control the crystallinity of each layer while simultaneously improving corrosion resistivity thereof.

Preferably the ferromagnetic layers used in the tunnel magnetoresistance (TMR) element of this invention are designed to measure 0.1 to 100 nanometers (nm) in thickness. The TMR element is typically formed into the shape of a thin-film, which is manufacturable by standard thin-film fabrication techniques including, but not limited tor molecular beam epitaxy (MBE) methods, sputtering methods, deposition methods, and the like.

A substrate adaptable for fabrication of a multilayer thin-film structure in accordance with the instant invention may be made of any one of currently available materials, including single-crystalline materials such as ceramics, metals, semiconductors and also polycrystalline materials as well as amorphous ones such as glass. In the case of employing a substrate with conductivity, an electrically insulative underlayer may be provided on its principal surface.

It is apparent especially from the foregoing explanation on the second and third preferred forms of the invention that the magnetic element incorporating the principles of the invention is adaptable for use with any one of electronic parts or components using prior known semiconductor materials, typically including logic elements. Using it as a bit cell in memory devices makes unnecessary extra semiconductor elements that have been inevitable in the related art while making it expectable to achieve a remarkable increase in integration density of such memory device, which in turn enables the device to be employed as nonvolatile memory devices—replaceable with DRAMs and flash memories—in IC cards and RFID cards plus large-capacity mobile files or else.

Figure 4:
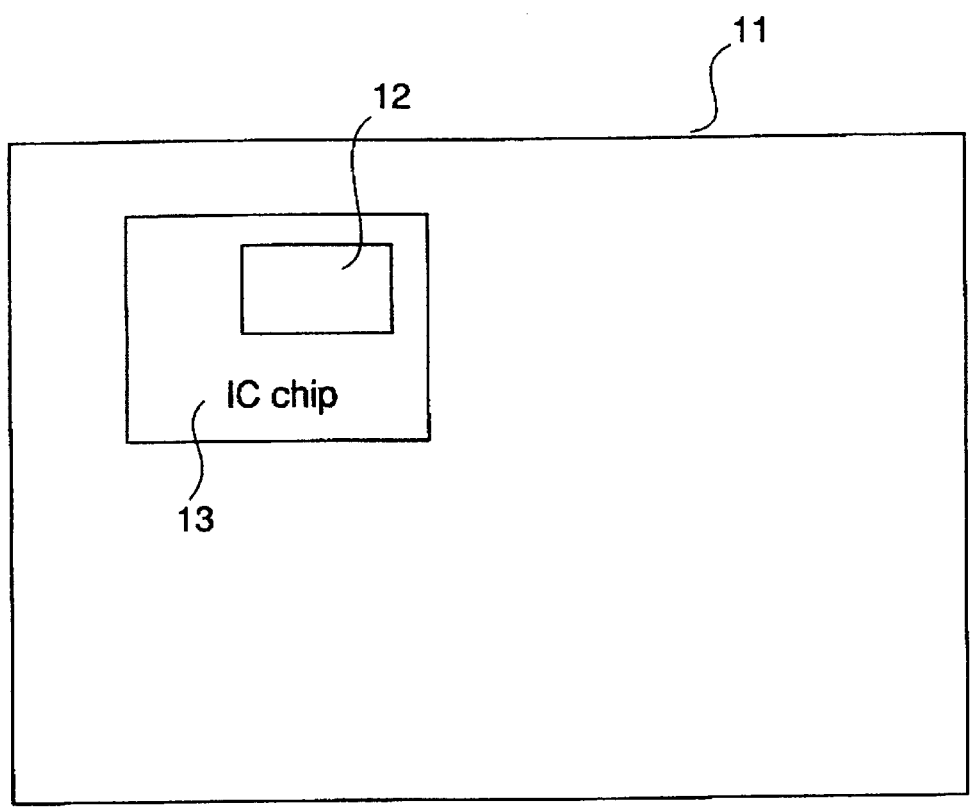
FIG. 4 is a diagram schematically showing a configuration of an IC card using the memory device embodying the invention.

Turning now to FIG. 4, there is shown in schematical form a basic configuration of an IC card.

As shown in FIG. 4 the IC card 11 is generally constituted from a base plate or substrate and an IC chip 13 mounted thereon, wherein the IC chip 13 includes a magnetic data storage device 12 embodying this invention. Employing the magnetic storage device 12 of the invention in such IC card or those electronic products including mass-storage mobile files and other systems makes it possible to provide highly integrated systems low in power consumption as compared to related art MRAMs.

In addition to the applicability to such magnetic storage device, the magnetic element of the invention may also be applied as electromagnetic heads and/or magnetic sensors in hard disk drive (HDD) units or magnetic field sensing elements and other types of magnetic elements.

Figure 5:
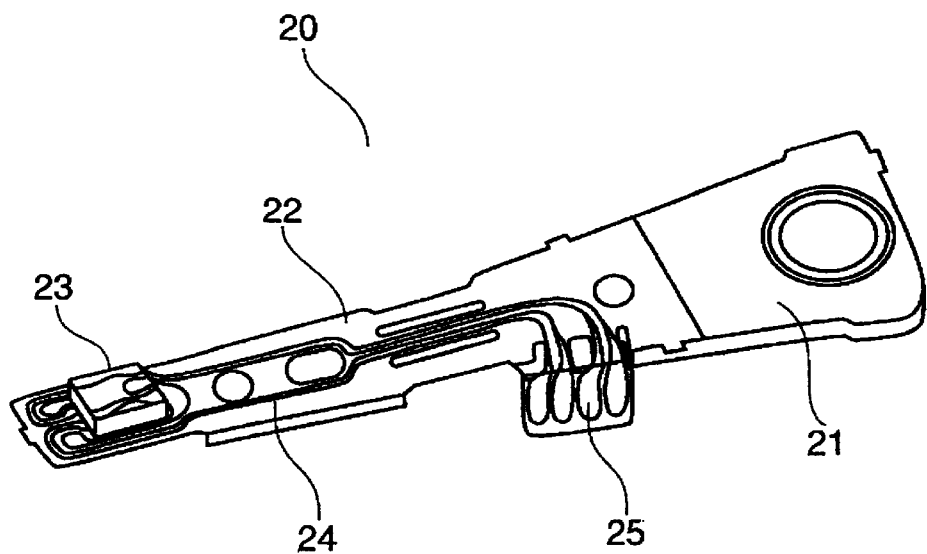
FIG. 5 is a diagram showing a perspective view of a head gimbals assembly adaptable for use in hard disk drive units, which assembly has a built-in magnetic read head using the element of the invention.

Typically a magnetic read head is formed on the principal surface of a substrate serving as a head slider. After having applied to the head slider those patterning processes required for head floating amount control, the slider is then mounted in a magnetic head assembly as shown in the perspective view diagram of FIG. 5. The head assembly 20 of FIG. 5 is arranged to have an actuator arm 21 with a bobbin unit or else for retaining a drivecoil by way of example. A suspension mechanism 22 is provided and coupled to one end of the actuator arm 21. The suspension22 has its distal end to which a head slider 23 is attached, this slider comprising a magnetic element in accordance with the preferred form of the invention stated supra. Suspension 22 has thereon electrical leads 24 for use in writing and reading data signals. These leads 24 are electrically connected to respective electrodes of a magnetic read head as mounted in head slider 23. In FIG. 5 the numeral 25 is used to designate electrode pads of magnetic head assembly 20.

Figure 6:
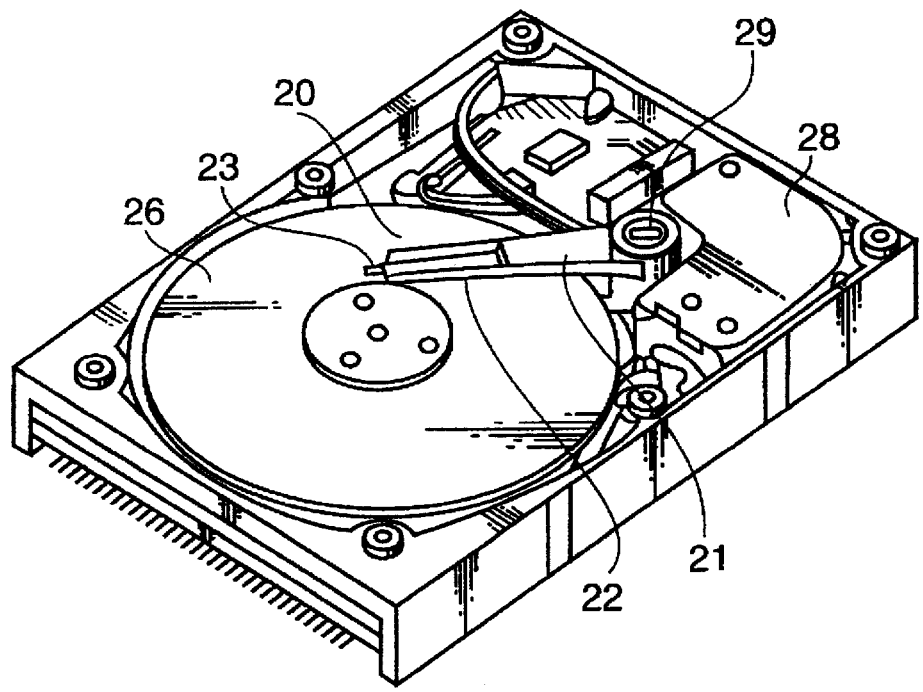
FIG. 6 is a diagram showing a perspective view of a hard disk drive with the head gimbals assembly of FIG. 5 mounted therein.

The magnetic head assembly 20 thus arranged is then built in magnetic recording apparatus such as a magnetic disk drive unit as shown in FIG. 6 FIG. 6 is a diagram showingin schematic form aperspective view of an overall structure of such magnetic disk device using a rotary actuator.

As shown in FIG. 6, more than one magnetic disk 26 is attached to a spindle 27 in sucha way that the disk is rotatably driven by an electric motor, not shown, operatively responsive to receipt of a control signal from a drive element control source, neither invisible in FIG. 6. Rotation of magnetic disk 26 at high speeds results in the head slider 23 being floating or "flying" over magnetic disk 26. In such head flying state, data is magnetically written or read into or from disk 26.

The magnetic head assembly 20 is coupled to one end of the actuator arm 21 with the bobbin and others for supporting a drive coil, not shown. Provided at the remaining end of actuator arm 21 is a rotary voice coil motor 28 that is one of known linear motors. The voice coil motor 28 is configured from a driving coil (not shown) wound around the bobbin of actuator arm 21 and magnetic circuitry including a permanent magnet and an opposed yoke which are disposed facing each other with the coil held therebetween.

The actuator arm 21 is stably supported by ball bearing units (not shown) as provided at upper and lower locations of a stationary or fixed shaft 29 in a way such that arm 21 is rotatably and slidably driven by voice coil motor 28 to be at a desired location along an arc-like locus on disk 26.

Embodiment 1

A structure of the double tunnel junction element using the layer of semiconductor fine particles 3 shown in the schematical structure diagram of FIG. 1A along with the manufacturing method thereof will now be explained with reference to sectional diagrams of FIGS. 1 and 7.

Figure 7:
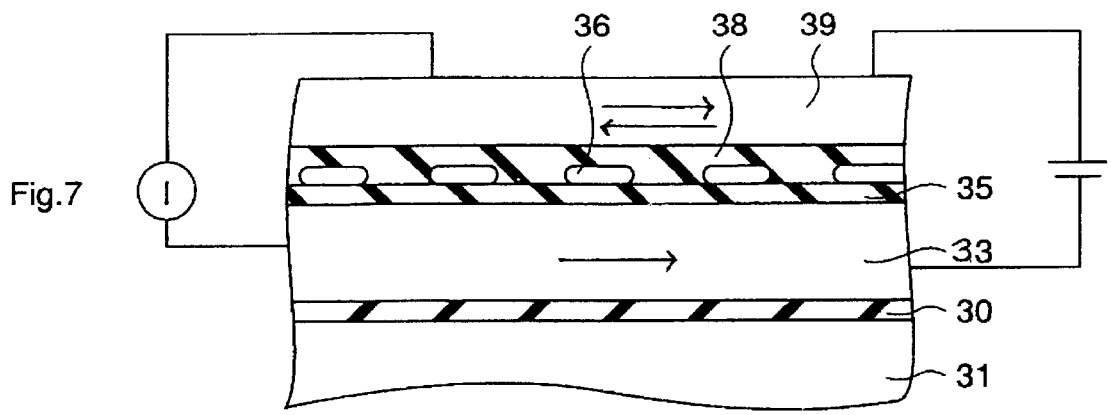
FIG. 7 is asectional diagram of four-terminal TMR element in accordance with a first embodiment of the invention.

As better shown in FIG. 7 the double tunnel junction element of the illustrative embodiment is structured from a silicon (Si) substrate 31 having a principal surface, a thermal oxide film 30 on the substrate surface, and a multilayer structure overlying substrate 31. The multilayer structure includes a ferromagnetic electrode layer 33 made of a cobalt (Co) to a thickness of approximately 10 nm. Layer 33 corresponds to the electrode 1 shown in FIG. 1. The structure also includes a dielectric layer 35 made of $Al_2O_3$ with its thickness of about 1.5 nm, which acts as the tunnel barrier layer corresponding to the layer 2 of FIG. 1. The multilayer structure also includes Si particles 36 corresponding to the semiconductor particles 3, each of which measures 8 nm in diameter, or more or less. The structure further includes an $Al_2O_3$ layer 38 with a thickness of about 2 nm for use as the dielectric layer (tunnel barrier layer) 4, and a nickel iron (NiFe) alloy layer 39 of about 5 nm in thickness acting as the ferromagnetic layer 5 in FIG. 1. The resultant tunnel junction area is about 0.4 $\mu m^2$.

This element is manufacturable in a way, which follows. Respective ones of the layers 33, 35, 36, 38, 39 were all fabricated by sputtering methods.

Firstly, as shown in FIG. 7, the Si substrate 31 is prepared. This substrate has the thermal oxide film 30 deposited on its principal surface. Then, the NiFe layer 33 is fabricated on thermal oxide film 30 to a thickness of 10 nm. Subsequently the $Al_2O_3$ layer 35 is formed thereon to a thickness of about 1.5 nm. Next, a nonmagnetic semiconductor film made of Si is fabricated on $Al_2O_3$ layer 35 to a thickness of about 2 nm. Observation using transmission electron microscope equipment has affirmed that the actually fabricated Si was grown in the form of powdery grains or fine particles with a diameter of about 8 nm. Further, as shown in FIG. 7, an $Al_2O_3$ layer 38 is formed to a thickness of 2nm, covering sidewalls and top surfaces of the underlying Si particles 36; subsequently, a Co layer 39 is formed to a thickness of 10 nm. Next, the resulting multilayer structure is subject to micropatterning processes using photolithography techniques to thereby manufacture the intended double tunnel junction element (with four terminals), which is 0.4 $\mu m^2$ in junction area.

Electrical resistivity of the resultant TMR element was measured in a way, which follows. A direct current (DC) voltage is applied between the NiFe layer 39 and Co layer 33 of FIG. 7 while simultaneously applying an external magnetic field thereto. During this, the magnetization directions of ferromagnetic electrodes are set so that these are in a parallel state and antiparallel state. An ampere meter I is then used to measure resistance values in respective magnetized states, which revealed the fact that the magnetoresistance ratio is about 10%. Note that although any appreciable magnetoresistance ratio are not observed in double tunnel junction structures using nonmagnetic metal fine particles sandwiched between two tunnel barriers as will be discussed later in conjunction with a comparative example, the fact that the magnetoresistance ratio was observed in the illustrative embodiment encourages a skilled person to believe that spin accumulation effect takes place within the nonmagnetic Si particles.

COMPARATIVE EXAMPLE

A double tunnel junction element was fabricated as a comparative example by substantially the same way as in the embodiment 1. This exemplary element is such that the Si particles are replaced with Al ones. These Al particles were about 8 nm in size. A multilayer structure of this example is photolithographically micro patterned to manufacture a four-terminal TMR element having a double tunnel junction structure with a junction area of 4 $\mu m^2$. Accordingly this example is similar in structure to the embodiment 1 except that the Al particles are used therein The example is then subject to resistivity measurement in a way such that a voltage is applied between ferromagnetic electrodes while applying thereto an external magnetic field. This results in that no magnetoresistance was observed. It may be construed that this is due to the fact that the charging energy of the Al particles is less than room temperature in comparison with semiconductor particles and that a spin relaxation time is short.

Embodiment 2

In this embodiment, a practically reduced structure of the 3-terminal TMR element that has been explained in conjunction with the second preferred form of the invention will be explained along with a manufacturing method of same.

Figure 2C:
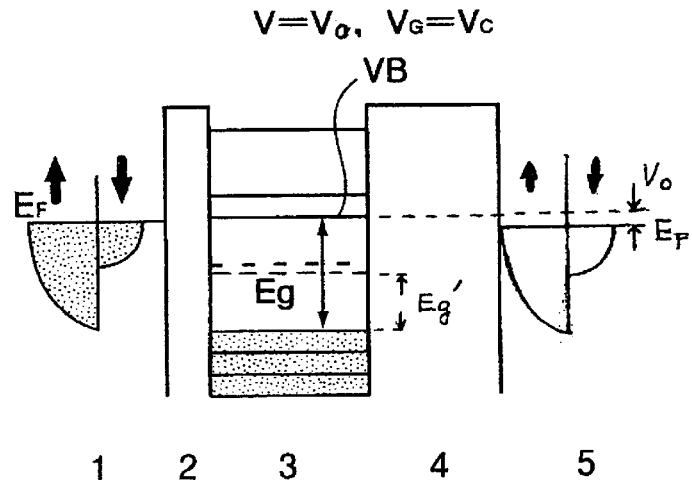
Figure 8:
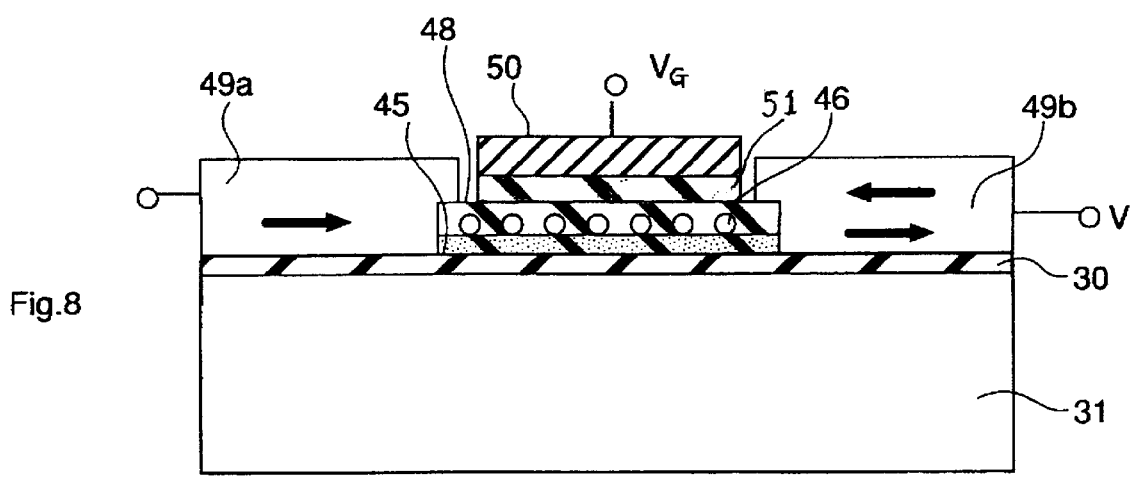
FIG. 8 is a sectional diagram of three-terminal TMR element in accordance with a second embodiment of the invention.

An explanation will first be given of the structure of 3-terminal TMR element of the embodiment 2 with reference to FIG. 2 and a sectional diagram of FIG. 6. This element has a Si substrate 31 with thermal oxide film 30 on its principal surface, on which a lamination of multiple layers is formed These layers include an $Al_2O_3$ layer 45 corresponding to the dielectric layer 2 noted above, Si particles 46 corresponding to the semiconductor particles 3, and an $Al_2O_3$ layer 48 corresponding to the dielectric layer 4. As shown in FIG. 8 this embodiment further includes a Co layer 49a and NiFe layer 49b corresponding to the ferromagnetic layers 1, 5 respectively, which layers 49a, 49b are laid out in the horizontal direction in which the semiconductor particles 3 are aligned. The separation between the electrode 49a, 49b is 0.3 micrometer. A gate electrode 50 corresponding to the control electrode 7 is formed overlying the $Al_2O_3$ layer 48. As in the Co layer 49a and NiFe layer 49b, selection of specific materials different in coercive force from each other enables the magnetization of one layer of less coercivity (i.e. NiFe layer 49b) to rotate upon application of an external magnetic field. Accordingly, in this embodiment, NiFe layer 49a may be used as a layer into which magnetization is written whereas Co layer 49a is as a layer for retaining magnetization. In the previous discussion using FIG. 2, the control electrode 7 is added to the semiconductor particles 3 with the dielectric film 6 disposed therebetween. In the element of FIG. 8, the gate electrode 50 is additionally provided thereto with the dielectric layer 51 laid therebetween. Such structure may be selected when the need arises.

A manufacturing method of this TMR element will be set forth with reference to FIG. 8. After having fabricated a multilayer structure consisting essentially of the dielectric layer 45, Si particles 46 and dielectric layer 48 by a manufacturing method similar to that as has been explained in conjunction with the embodiment 1, photolithography is used to micro pattern it into a rectangular shape of about 4 $\mu m^2$. Subsequently, films of the Co layer 49a and NiFe layer 49b are formed in this order, which are then subject to photo lithographical processes thereby forming the TMR element shown in FIG. 8. In case the same material is used for the two ferromagnetic layers 49a and 49b, the required cross-section or profile is obtainable at a single photolithography process step. In the case of employing the same material in this way, an antiferromagnetic film is to be disposed adjacent to one of these antiferromagnetic layers to thereby provide a difference in coercivity between them, as has been discussed previously. The gate electrode 50 and the dielectric layer 51 are formed by film fabrication techniques such as sputter deposition methods and by photolithography techniques, prior to formation of the ferromagnetic layers 49a and 49b or alternatively after completion of same. The resultant element may be arranged to additionally include an oxide film and/or nitride film as its interlayer dielectric film(s).

An explanation will next be given of characteristics of this TMR element. While applying a potentially constant voltage of 0.1 volt (V) between the ferromagnetic layers 49a and 49b and simultaneously applying a potentially variable voltage $V_G$ to the gate electrode, tunnel resistance values were measured in the applied magnetic field, before and after the voltage $V_G$ varies in potential. When $V_G$=0, any current flow was not observed. When $V_G$ is greater than or equal to 0.5 V, a current flows resulting in observation of a magnetoresistance ratio of about 10%.

Fourth Form

A third aspect of the present invention is related to a magnetic memory device capable of reading data at high speeds while reducing power consumption, in particular to a magnetic memory device incorporating spin-dependent tunneling effect elements, each of which offers data storage functionality based on the changeability of its electrical resistivity with a change in voltage as externally applied thereto. This preferred form of the invention will be explained in detail below.

Figure 9:
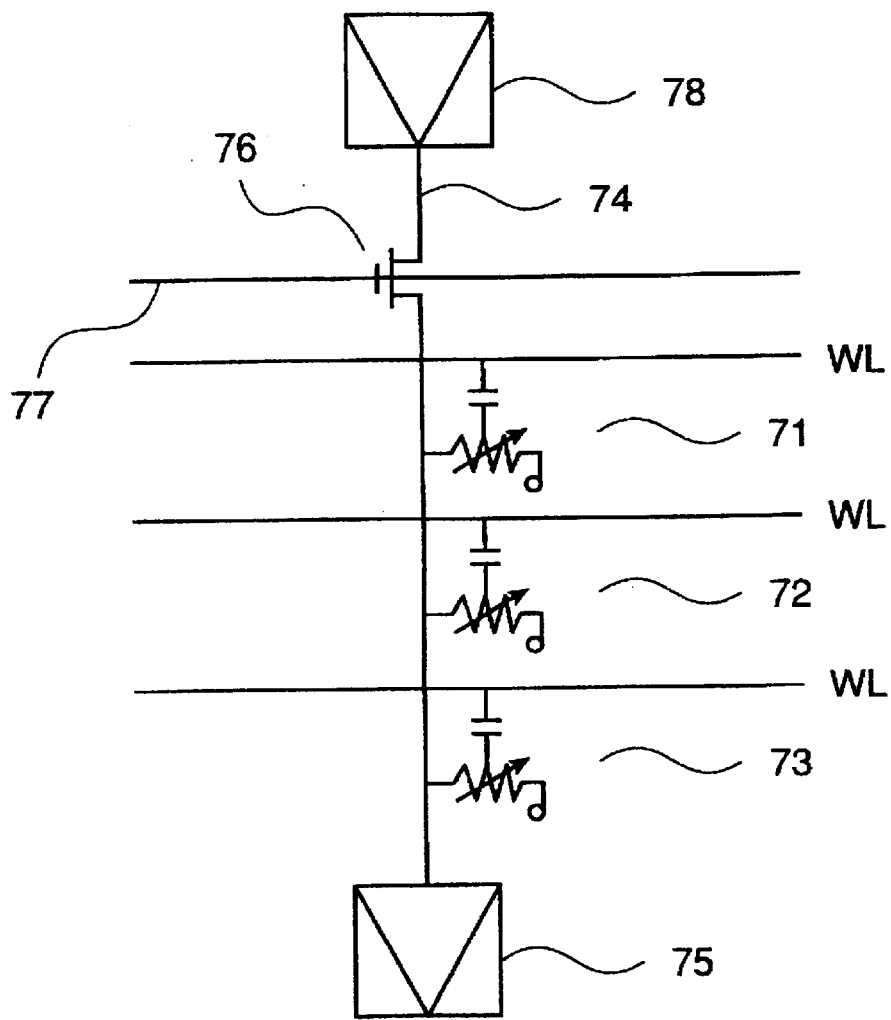
FIG. 9 is a diagram for explanation of a magnetic memory device in accordance with a third preferred form of the invention.

An optimal approach to establishment of highly integrated memory cell layout in the magnetic memory device using spin-dependent tunneling effect elements embodying the invention is to dispose memory cells 71–73 in parallel to a data line 74 operatively associated there with as schematically depicted in FIG. 9, with select transistors being removed away from the individual cells 71–73.

Regrettably, mere use of such parallel layout of memory cells 71–73 relative to the data line 74 would result in an electrical sense current badly behaving to partly flow back or "divert" into respective cells 71–73. This in turn results in that a signal as output to a sense amplifier 75 is reduced at 1/N (N is the number of memory cells) of an actual cell output signal, which is a serious bar to achievement of sufficient signal-to-noise ratios. To avoid this problem, the spin-dependent tunneling effect element constituting each cell is specifically designed so that its tunnel resistance value is rendered variable depending on a voltage as externally applied thereto via a corresponding one of word lines WL.

A data-line driving transistor 76 is connected to a constant current source 78. Data reading is performed by setting word lines 77 at a high voltage potential and then causing the data line driver transistor 76 to turn on, thus permitting a sense current to flow from constant current source 78 toward data line 74.

Suppose thatthe tunnel resistance value of spin-dependent tunneling effect memory cells is at $R_0$ upon externally applying of a voltage thereto via respective word lines WL (ON state) or, alternatively, at $FR_0$ in the absence of such voltage (OFF state). Here, "F" is a positive constant number greater than or equal to 1. Assume that the spin-dependent tunnel effect memory cells are $\Delta R_0$ in magnetoresistance change amount. Consider an ideal case where a parallel combination of spin-dependent tunneling effect memory cells with the same characteristics is connected to a single data line. Imagine that one memory cell is set in the ON state while letting the remaining cells be in OFF state. If this is the case, a "virtual" magnetoresistance change amount $\Delta R$ as looked at from an associative sense amplifier and a junction resistance value R are given as a function of N/F.

Figure 10:
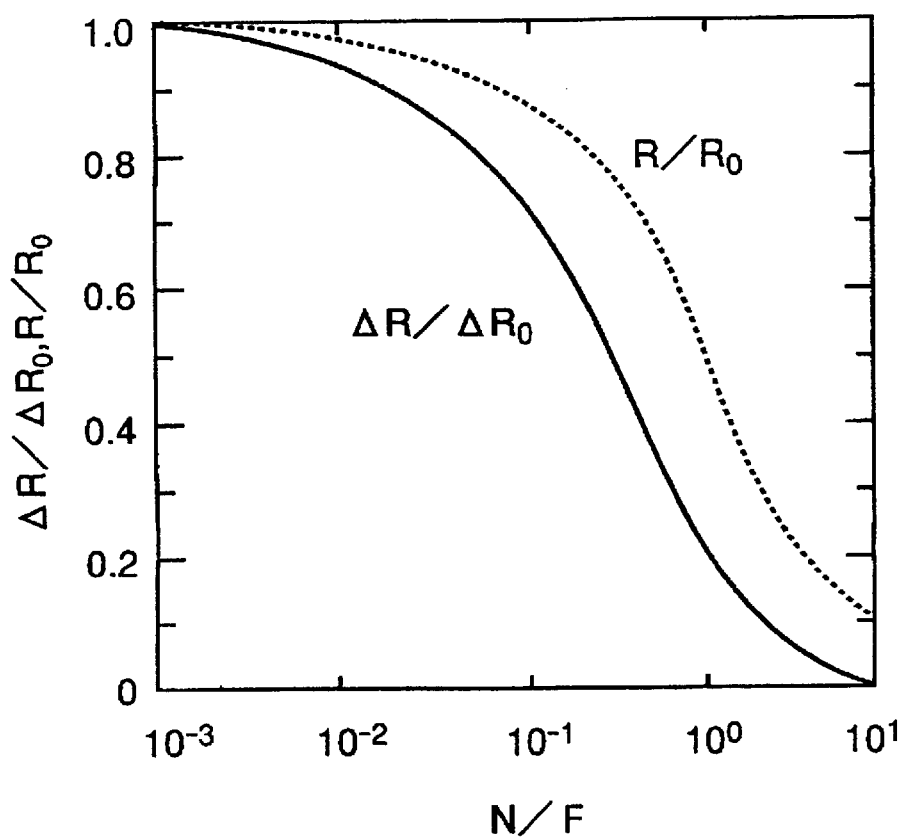
FIG. 10 is an explanation diagram showing a resistivity change amount and resistance value of the magnetic memory device as a function of a cell number and turn-on/off resistivity change rate.

See FIG. 10, which is a graph showing a relation of $\Delta R/\Delta R_0$ and $R/R_0$ versus N/F. The both values of $\Delta R/\Delta R_0$ and $R/R_0$ are at or less than 0.1 when N/F=10, e.g. in case any appreciable resistance change is absent in turn-on and -off events (F=1) and ten separate memory cells are connected in parallel. On the other hand, when $N/F<10^{-1}$, the values of both $\Delta R/\Delta R_0$ and $R/R_0$ are at about 0.8 or more.

Figure 11:
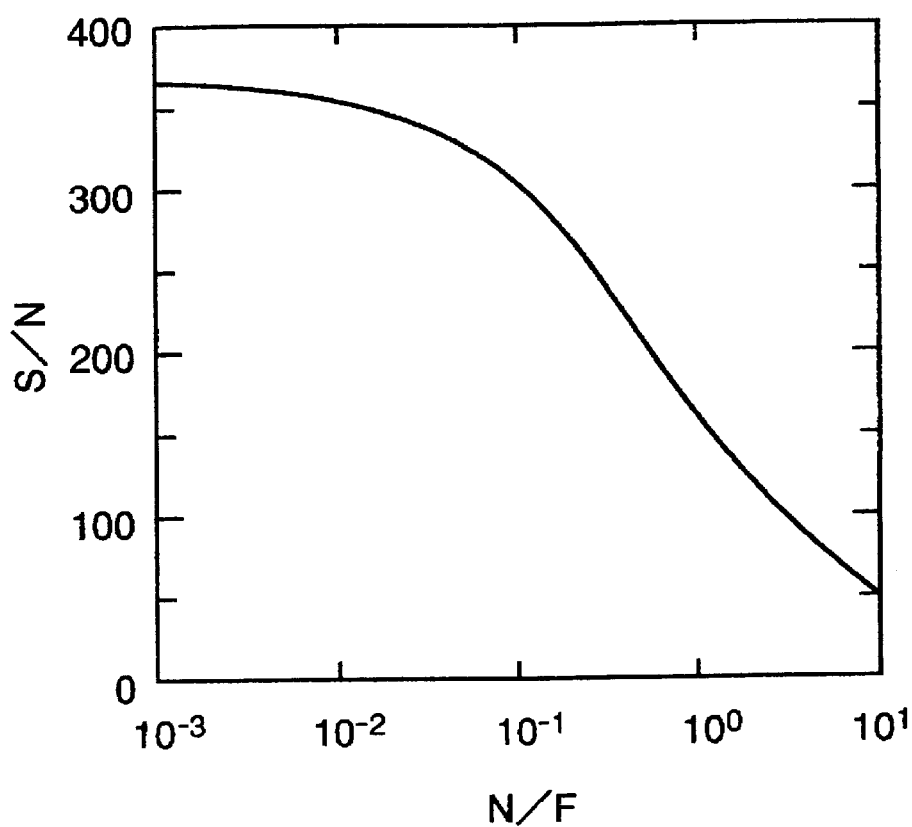
FIG. 11 is an explanation diagram showing a signal-to-noise ratio of the magnetic memory device as a function of the cell number and turn-on/off resistivity change rate.

Referring to FIG. 11, there is shown a relation of a signal-to-noise (SIN) ratio versus N/F under an assumption that a noise source used is of Johnson noise. Here, $R_0$ was set at about $10^5 \Omega$, $\Delta R_0/R_0$ was at about 1.5, and a band width was about 100 MHz. Currently available semiconductor memories are typically about 300 in S/N ratio.

When N/F=10, the S/N ratio is less than or equal to about 50. Thus, in order to perform reading of storage data under this condition, it should be required that multiple stages of sense amplifier circuits be provided while at the same time lengthening a time as taken to read data.

In contrast, increased S/N ratios in excess of about 300 are obtained when N/F<$10^{-1}$, which makes it possible to employ prior known semiconductor memory architectures to achieve high-speed read operations. Further, when N/F<$10^{-2}$, S/N ratios of about 350 or greater are obtained, which will be more preferable. N/F<$10^{-2}$ is attainable as long as the turn-on/off resistance change is about $10^3$ or more in cases where more than ten memory cells are connected in parallel together.

In a single tunnel junction structure consisting of a couple of conductive layers with an insulative layer sandwiched therebetween, the current versus voltage characteristics thereof typically exhibits linearity; however, an expected difference in electrical resistivity occurring due to a biasing voltage within a voltage region of about 100 mV or below at room temperature is several times at most. On the contrary, in a multiple tunnel junction structure with an increased number of conductive/insulative layer laminations, it is possible by potentially changing an externally applied voltage to force the value of junction resistivity to vary within an extended range up to more than $10^3$ times even at room temperature. The same goes with a nanostructured multiple tunnel junction with a layer of conductive fine particles as distributed in the insulative layer or, alternatively, with a tunnel junction structure with its gate electrode made of semiconductor material.

An explanation is now given of a specific means for adding switching functionalities to the tunnel junction of one exemplary double tunnel junction structure with lamination of multiple layers consisting essentially of a ferromagnetic electrode 1, dielectric layer 1, gate layer, dielectric layer 2 and ferromagnetic electrode 2. Consider the tunneling from the ferromagnetic electrode 1 toward the gate layer in the structure. Now suppose that a single electron attempts to tunnel into the gate layer. When an electron tunnels into the gate layer, the electrostatic potential of the gate layer is increased by $E_C=e^2/2C$, where C is the capacitance of such gate layer. When C is sufficiently small in value and also the value of $E_C$ is greater than a measurement temperature $k_BT$, the electron is incapable of accepting from lattice variation any energy necessary for tunneling; thus, no tunneling takes place, and the so-called Coulomb blockade effect occurs. Letting the tunnel resistivity of dielectric material 1 be represented by $R_1$ and that of dielectric layer 2 be given as $R_2$, the resulting junction resistivity in tunneling-occurrable events (ON state) is substantially equal to $R_1+R_2$; on the other hand, when tunneling is incapable of occurring (OFF state), the junction resistivity is expected to be $R_1R_2$ even when calculation is done by also taking account of those high order tunneling process. The electrostatic potential $E_C$ of the gate layer is controllable by appropriate adjustment of either a voltage $V_G$ of a third gate electrode as capacitance-coupled to the gate layer or a voltage difference V between the ferromagnetic electrodes 1 and 2. Accordingly, proper adjustment of such external voltage enables the tunnel junction to change in electrical resistivity for about $10^3$ times or more. To make the "Coulomb blockade" effect take place at room temperature, it is required that the gate layer be designed to measure at least about $2\times10^{-18}$ F or less in capacitance value. One way of obtaining such decreased electrostatic capacitance is to employ a specific structure with a layer of conductive fine particles dispersed within a dielectric layer or layers. To obtain the electrostatic capacitance, the conductive fine particles are required to measure about 2 nm or less in diameter. With this particle diameter setting, the significance of an expected Coulomb gap is 90 mV, or more or less.

Although in the structure with the layer of conductive fine particles distributed or scattered in the insulative layer these conductive particles are typically made of ferromagnetic materials, nonmagnetic materials may alternatively be employable where necessary. If the spin relaxation time $\tau_{sf}$ within a nonmagnetic material used is longer than a tunneling time $\tau_1$, as determinable by the product of a junction resistance value and junction capacitance value, then chemical potential shift $\Delta\mu$ occurs in nonmagnetic fine particles in a way dependent upon the spin direction thereof. This is what is called the spin accumulation effect. Due to this, an electron that has tunneled from the ferromagnetic electrode 1 into the nonmagnetic material is capable of tunneling into the ferromagnetic electrode 2 while retaining its spin direction, therebypermittingoccurrenceof achangeinmagnetic resistivity in a way depending on the magnetization layout of the ferromagnetic electrodes 1, 2. In case the particle diameter is decreased for purposes of the junction capacitance reduction, ferromagnetic fine particles are such that irregular variation or turbulency in magnetization direction will gradually become remarkable, which can occur due to thermal disturbance as resulted from decreases in anisotropic energy. Whenever the magnetization direction is in disorder, the spin direction of an electron tunneled experiences dispersion resulting in a decrease in magnetoresistance ratio. This problem will no longer occur in the case of spin accumulation effect used.

The conductive particles may be replaced with those of semiconductor materials where necessary. In the case of semiconductor materials, the intended spin accumulation effect readily takes place because their spin relaxation time $\tau_{sf}$ is inherently longer than that of metals. In addition, semiconductor materials are extremely less in number of electrons as contained therein when they are in the form of particles, as compared to that of metallic particles of the same size; consequently, the resulting chemical potential shift amount $\Delta\mu$ dependent on the spin occurring due to the spin accumulation effect becomes greater than that of metals. This makes it possible to obtain a further increased magnetoresistance change amount.

As semiconductors have band gaps, it is possible to add switching functionalities to the tunnel junction without the use of the Coulomb blockade effect. More specifically, when a potential difference stays less between the ferromagnetic electrodes 1, 2 while the Fermi level of ferromagnetic electrode 1 resides within the band gap of semiconductor, any appreciable tunnel current hardly attempts to flow (OFF state). A tunnel current flows (ON state) when applying a voltage from the third gate electrode to semiconductor fine particles within dielectric materials while forcing the bottom of the conduction band of semiconductor to be identical with the Fermi level of ferromagnetic electrode 1. In the ON state an electron that has been spin-polarized from ferromagnetic electrode 1 into semiconductor behaves to tunnel, resulting in creation of the non equilibrium spin accumulation effect in semiconductor fine particles used. Generally the width of the band gap in semiconductors is in the range of from about 1 to 2 eV, which is much greater in value than that of a Coulomb gap occurring due to Coulomb blockade effect, wherein the former value is different by one order of magnitude from the latter. Accordingly, in case this function is utilized to achieve the switching functionality required, it becomes possible to widen or expand the turn-off region with respect to a bias voltage being presently applied, which encourages a technician in the art to believe that this is a preferable form in terms of establishment of operation margins.

With the device structure having conductive fine particles dispersed within dielectric material in the form of a layer in the way stated supra, it is possible to allow more than one resonance energy level to occur owing to a quantum confinement effect. This can be the because those electrons contained in this part stays less in number. This feature may be utilized to provide the so called resonance tunneling effect, which in turn makes it possible to add the switching functionality required. In particular, semiconductor fine particles are inherently less in number of electrons per unit volume in comparison with metals, which permits resonance levels to increase in distance therebetween thus enabling accomplishment of a turn-off region with an increased width.

Although some embodiments in accordance with a fourth preferred form of the present invention will be set forth below, the invention should not be limited only to such embodiments.

Embodiment 3

Figure 12A:
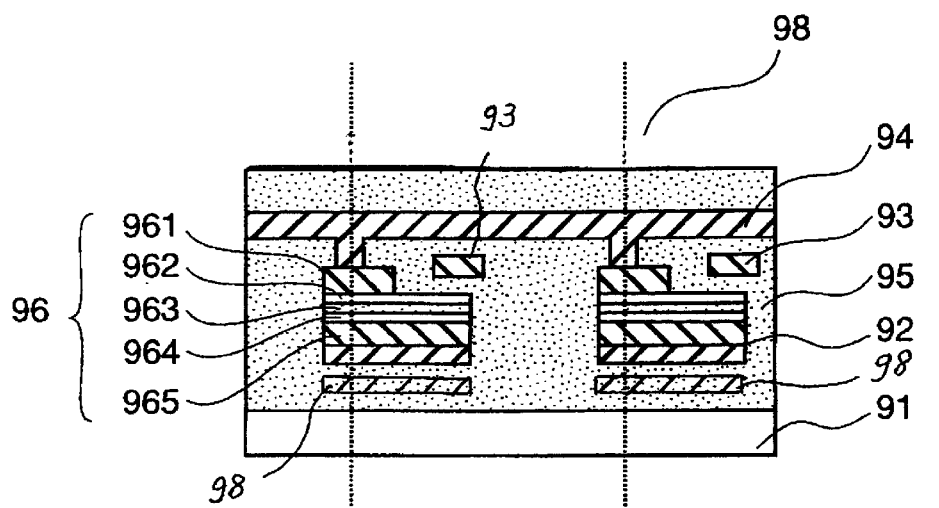
FIGS. 12A and 12B are respectively a sectional diagram and a plan view diagram pictorially showing a magnetic memory device in accordance with a third embodiment of the invention.
Figure 12B:
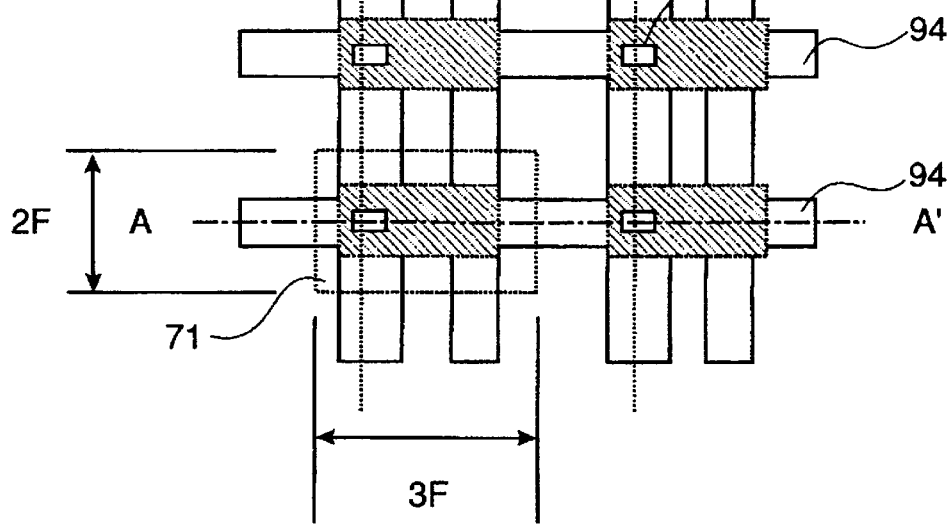

FIG. 12A is a diagram showing a cross-sectional view of a memory cell for explanation of a magnetic memory device utilizing the spin-dependent tunneling effect element with switch functions in accordance with the first embodiment of the invention. FIG. 12 is a plan view of a plurality of neighboring memory cells. Note here that peripheral semiconductor circuitry (including a current source, voltage source, sense amplifier, address decoder, etc.) operatively connected to the illustrative memory cells are implementable by use of conventional IC/ULSI technologies in a way well known among those skilled in the semiconductor art, and thus a detailed explanation thereof will be eliminated herein.

This embodiment includes a semiconductor substrate 91 with bit lines 92 and word lines 93, write word lines 98 and data lines 94 being formed on or over a top surface of the substrate in such a manner that these lines are three-dimensionally crossed over one another. Each line is electrically isolated from the others by an interlayer dielectric film 95. A tunnel magnetoresistive (TMR) element 96 is formed in a specified region in which a corresponding one of bit lines 92 crosses over or "intersects" its associated data line 94. Its lower end the upper end of bit line 92 is connected through a contact hole 97 to its overlying data line 94. With this embodiment the cell area per memory cell is approximately $6F^2$, where F is the line width of bit line 92 and data line 94 and a minimal distance therebetween. In light of the fact that presently available memory cells each employing an additional select transistor formed of a MOSFET are typically about $12F^2$, in unit cell area, the illustrative embodiment is capable of greatly improving the integration density of memory cells used.

the TMR cell element 96 has a multilayer structure consisting of an upper ferromagnetic electrode 961, upper insulative or dielectric layer 962, gate layer 963, lower dieletric layer 964, and lower ferromagnetic eletrode 965, thereby forming a ferromagnetic double tunnel junction. The gate layer 963 is capacitance-coupled to its associated word line 93 via the upper dielectric layer 962 and interlayer dieletric film 95, wherein gate layer 963 is potentially controllable by letting word line 93 change in voltage.

An exemplary arrangement of respective layers of the spin-dependent TMR cell element in this embodiment is such that the upper ferromagnetic electrode 961 and lower ferromagnetic electrode 965 are each formed of a lamination film of "soft" magnetic materials, such as NiFe or else, and ferromagnetic materials with high spin polarization of conduction electrons such as Co or CoFe or else and that the upper and lower dielectric layers 962 and 964 are made of $Al_2O_3$ whereas the gate layer 963 is formed of a ferromagnetic nano-structure tunnel junction using ferromagnetic fine particles of CoPt or the like as dispersed in an $Al_2O_3$ matrix. The intended switching function in this case is achieved by utilization of either Coulomb blockade effect or resonant tunneling effect occurring in gate layer 963.

In this embodiment the TMR cell element 96 may required to:

(1) have therein more than two ferromagnetic layers with its tunnel resistance value variable depending on relative angles of magnetizations in these ferromagnetic layers; and (2) permit the tunnel resistance value of spin-dependent TMR cell 96 to change or vary with a change in potential of gate layer 963.

As long as the TMR cell element 96 satisfies the requirements above, this element is structurally modifiable and alterable in a variety of different ways when reduction to practice- Another possible exemplary structure is such that the gate layer 963 is replaced with nonmagnetic metal or semiconductor fine particles as dispersed in dielectric material. Yet another example is that gate layer 963 is formed of one selected from the group consisting of a ferromagnetic metallic ultra-thin film, nonmagnetic metal ultra thin film, and semiconductor ultra thin film, the films having a film thickness of several nanometers or less. In any event the intended switching function is attainable by utilization of either the Coulomb blockade effect or resonant tunneling effect occurring in gate layer 963. In the case of semiconductor fine particles used therein, it will also be able to utilize the band gap of such semiconductor fine particles for achievement of the switching function.

A storage data read operation in this embodiment is as follows Upon selection of one from an array of memory cells each including a TMR element 96, let a bit line 92 and data line 94 coupled to the selected cell be connected to peripheral semiconductor circuitry operatively associated therewith. Thereafter, apply a specific critical voltage $V_g$ to a word line 93 coupled with the selected TMR cell element 96, which voltage is determinable depending on the configuration of TMR cell 96. Applying the critical voltage $V_g$ causes the cell 96 to turn on, thus reading data out of it. Since in this embodiment the data line 94 and word line 43 are designed to cross over each other, only a data bit being presently stored in the selected cell 46 at an "intersection" between data line 94 and word line 93 will be read therefrom.

Use of the TMR element with switching functionality for each memory cell in the way stated above makes it possible to avoid a need to employ any extra cell-selecting elements suchas semiconductor transistors ordiodesorelse inindividual cells, which is devoted to accomplishment of significant technical advantages.

In those structureswitha semiconductor element connected to a TMR cell element, a flow of sense current inevitably results in creation of a voltage drop at such selector. One example is that in highly miniaturized MOSFETs or pn-junction diodes as micro fabricated with a minimal feature size of 0.25 micrometers, this voltage drop is as large in magnitude as about some hundreds of mV. Accordingly, occurrence of about 10% of variation in the characteristics of such cell select transistor or diode can result in creation of increased noises up to several tens of mV. This noise level is equivalent in significance to an output voltage of TMR element per se, which undesirably serves to lower signal-to-noise ratios.

Special care should also be taken to manufacture an interconnect part for electrical connection between a TMR element made from a metal and its associated semiconductor selector element while retaining the inherent characteristics thereof.

In those structures with a semiconductor diode serially connected to each memory cell including a TMR element, these suffer from a problem as to difficulties in improving signal-to-noise ratios due to the fact that fabrication of the TMR element overlying the diode is difficult and that the diode is substantially the same in electrical resistivity as TMR element with increased variability in resistance value.

Figure 13A:
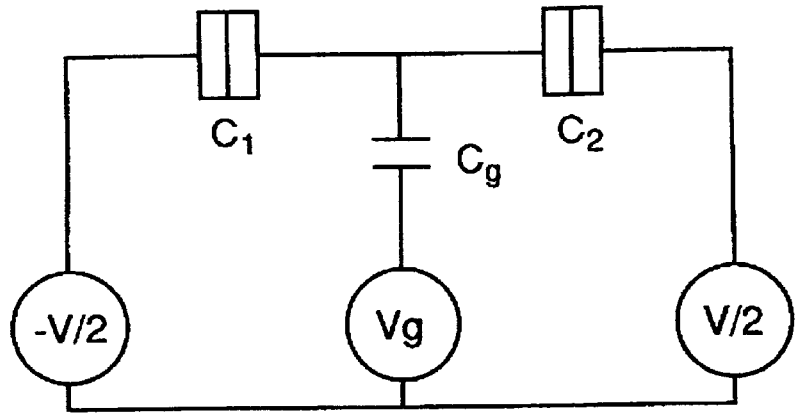
FIGS. 13A and 13B are diagrams for explanation of an operation of the magnetic memory device of the third form of the invention.
Figure 13B:
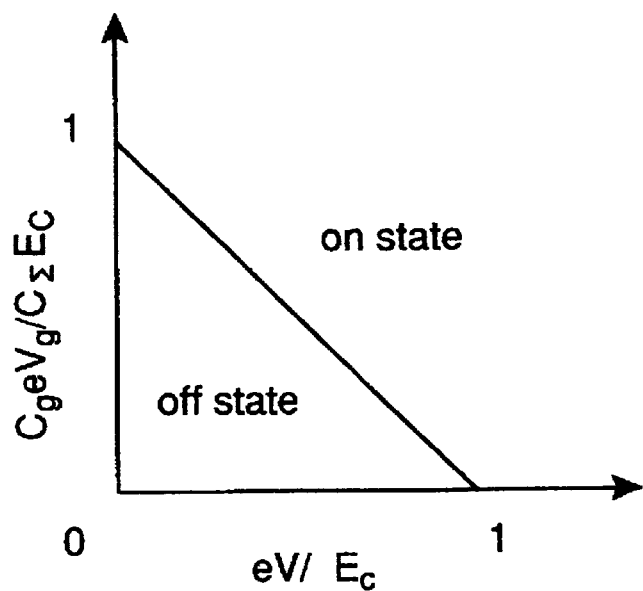

In contrast, with the memory array incorporating the principles of the invention, eliminating the use of any separate semiconductor devices such as transistors or diodes or the like within each memory cell makes it possible to avoid the problems occurring due to unwanted variation in semiconductor device characteristics while at the same time advantageously reducing complexities of memory cell array manufacturing methodology In cases where the Coulomb blockade effect is utilized to attain the intended switching functionality, the turn-on/off states of TMR cell element 96 depend both on a potential difference between the upper ferromagnetic electrodes 961 and lower ferromagnetic electrode 965 and also on a voltage potential $V_g$ of gate layer 963. See FIG. 13A, which schematically depicts a circuitry of the TMR element 96. Also see FIG. 13B which is a diagrammatic representation of the turn-on and -off states of such element 96. Here, a combined capacitance value $C_\Sigma$ is equal to $C_1+C_2+C_g$ whereas a charging energy $E_C$ is $e^2/2C_\Sigma$.

More specifically the value of voltage potential $V_g$ of gate layer 963 as required to cause the TMR element 96 to turn on is variable with a change in a potential difference V between the upper ferromagnetic electrode 961 and lower ferromagnetic electrode 965. Further, when the potential difference V becomes $eV>E_C$, the TMR element behaves to transit into its turn-on state irrespective of the value of $V_g$. In case either the resonant tunneling effect or the semiconductor band gap is utilized for the switching function, specified relations $eV<$ and $eV<E_g$, should be established, where is a discrete energy levels separation and $E_g$ is a distance between the semiconductor Fermi level and the bottom of the conduction band.

From the foregoing it will be appreciated that in order to enable the embodiment memory device to offer reliable cell selectability using word line voltage $V_g$, any potential differences V between those bit lines 92 and data lines 94 to which non-selected TMR cell elements 96 are coupled should be required to satisfy the condition of $eV<E_C$ during reading. An approach to satisfying this condition is to i) control the value of a sense current letting a potential drop $V_S$ at spin-dependent tunnel effect cell 96 be $eV_S<E_C$, and ii) independently control voltage potentials of those data lines 94 with non-select TMR cells coupled thereto.

It should be noted that in regard to details of a cell data read procedure and data write methodology employable in the embodiment memory device, prior known current sensing techniques may be used with or without co-using magnetization inversion/switching techniques utilizing current magnetic fields. The embodiment discussed above is practically implementable by simply employing related art magnetic memory architectures and semiconductor memory technologies except for the memory cell's switching functionality unique to the invention. This in turn makes it possible for the embodiment device to retain maximized compatibilities with traditional architectures. In this respect also, the embodiment offers significant advantages.

Embodiment 4

An explanation will next be given of an embodiment in accordance with a fourth preferred form of the invention. FIG. 14A is adiagram illustrating in schematical cross-section one of those memory cells used in the magnetic memory device of the second embodiment, which employs a TMR element with switching functionality. In addition, FIG. 14B depicts a plan view of a layout pattern of neighboring memory cells. Regarding this embodiment, its specific structural features different from the first embodiment will be explained in detail below.

A principal difference of this embodiment over the first embodiment is that gate layers 963 of neighboring spin-dependent TMR cell elements 96 overlying the same bit line 92 are capacitively coupled to different word lines 93. Thus, it becomes possible to achieve the intended cell data reading scheme by use of related art folded data line configurations along with known differential sense-amplifier circuitry, which in turn makes it possible to further increase signal-to-noise ratios. Additionally the cell area per memory cell in this embodiment is as large as about 6.25 $F^2$; thus, the resultant integration density may be increased even in this embodiment.

Embodiment 5

Figure 15A:
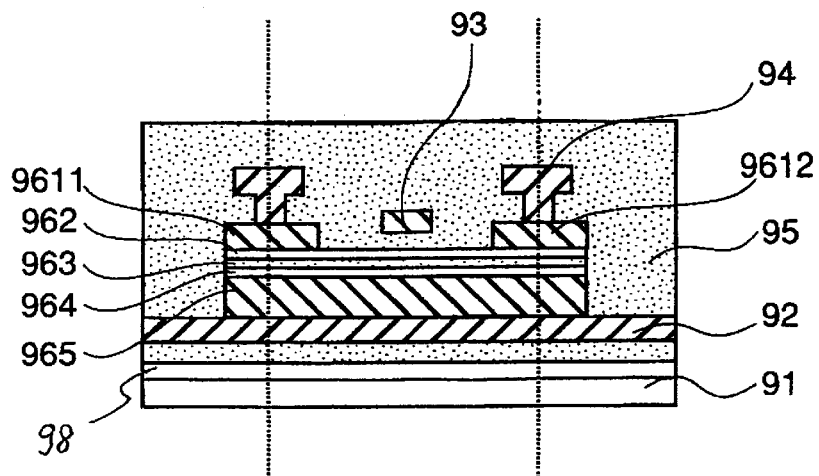
FIGS. 15A and 15B are respectively a sectional diagram and plan view diagram pictorially showing a magnetic memory device in accordance with a fifth embodiment of the invention.
Figure 15B:
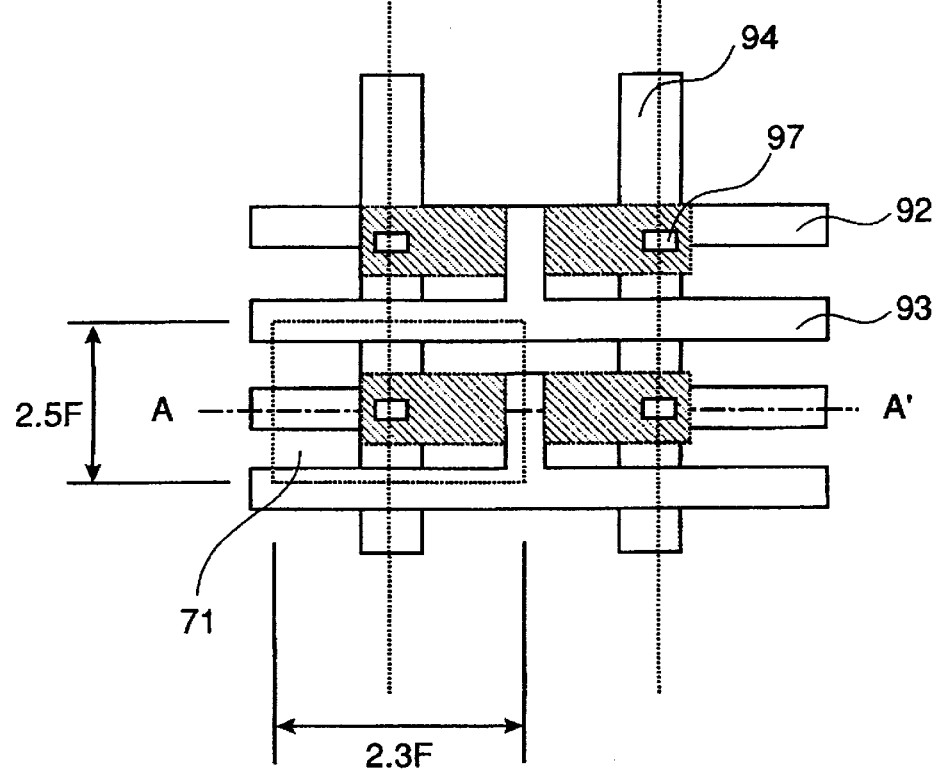

A third embodiment of the invention will next be set forth below. FIG. 15A is a diagram schematically showing a cross-sectional viewof one of memory cells used in the magnetic memory device of the embodiment 5, which employs a TMR element with switching functionality. In addition, FIG. 15B is a plan view of a layout of adjacent memory cells. As per this embodiment, its specific structural features different from the third embodiment will be described in detail below.

The illustrative embodiment is different from the third embodiment in structure of TMR cell element 96. This embodiment is specifically arranged so that the TMR element 96 for use as a memory cell comes with two different upper ferromagnetic electrodes 9611 and 9612, which are connected via different contact holes 97 to different data lines 94. The two upper ferromagnetic electrodes 9611 and 9612 function as different data storage nodes respectively. Cells election during storage data reading is done in combination with a data line 94 and its associated word line 93 cross over or "intersecting" the data line 94.

This embodiment is suitable for use in certain forms utilizing a current magnetic field during reading. More specifically, the lower ferromagnetic electrode 965 acting as the magnetization inverting or "switching" layer during reading is commonly shared by the two upper ferromagnetic electrodes 9611, 9612 so that it becomes possible to integrate or "bundle" those write word lines 98 for two memory cells together into a single signal transmission line. Furthermore, the write lines 98 may be increased in line width, which in turn makes it possible to reduce or minimize electrical power consumption in theevent of creation of current magnetic fields. Additionally the intended cell selectability during writing is achievable by co-use of a current magnetic field that takes place at data and bit lines 94 and 92.

In addition, the cell area per memory cell of this embodiment is as large as about $5.75F^2$, thus enabling improvement of integration density in this embodiment also.

Embodiment 6

Figure 16A:
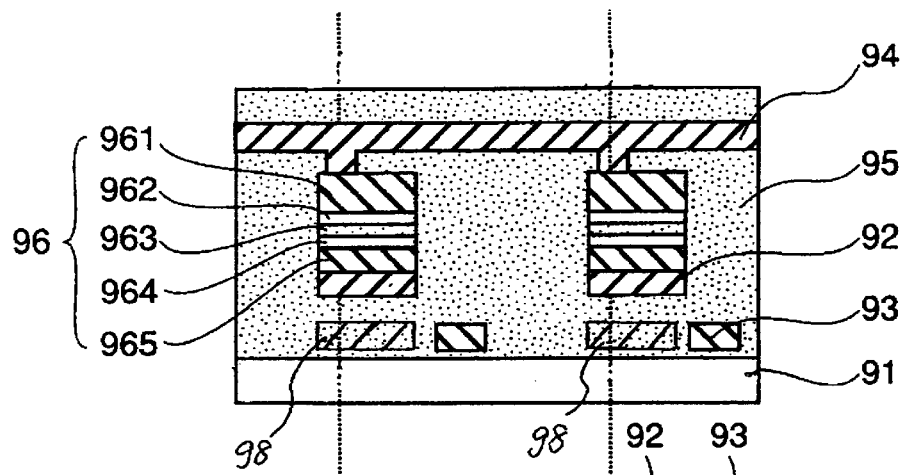
FIGS. 16A and 16B are respectively a sectional diagram and plan view diagram pictorially showing a magnetic memory device in accordance with a sixth embodiment of the invention.
Figure 16B:
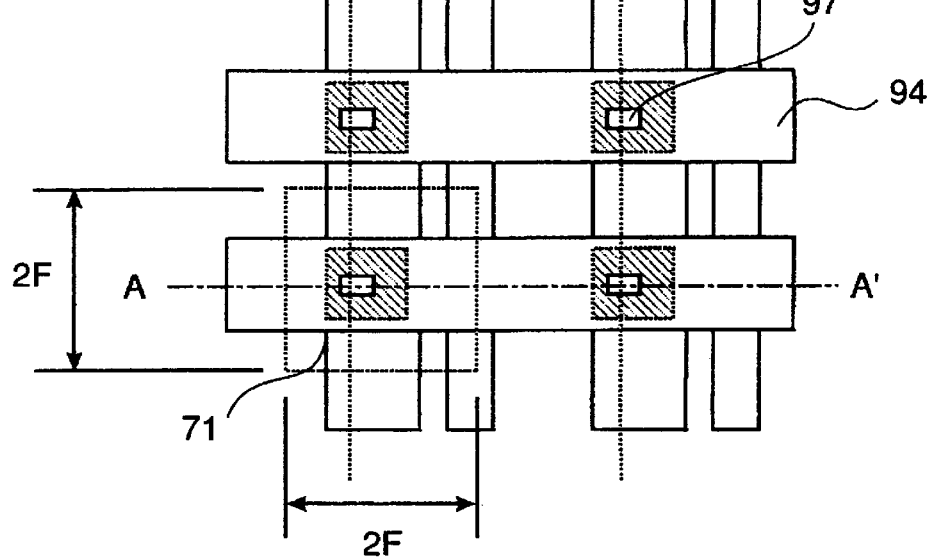

A sixth embodiment of this invention will next be explained. FIG. 16A is a diagram schematically depicting a sectional view of one of memory cells used in the magnetic memory device of the sixth embodiment, which employs a spin-dependent TMR element with switching functionality. In addition, FIG. 16B shows a plan view of alayout of adjacent memory cells. Regarding this embodiment, its specific structural features different from the third embodiment will be described in detail below.

This embodiment is different from the first embodiment in that word lines 93 are provided underlying the lower ferromagnetic electrode 965 In this case a lateral distance between a word line 93 and its associative TMR cell 96 in FIG. 16A may be reduced to less than about F/2, which makes it possible to greatly shrink the cell area. In this embodiment a cell area per memory cell is about $4F^2$.

From the foregoing it would be appreciated that with the magnetic memory device in accordance with the third invention, letting each memory cell employ therein a specifically designed TMR element with switching functionality makes it possible to noticeably reduce or shrink the cell area while at the same time retaining signal-to-noise ratio values similar to those in the case of using additional cell select transistors. As a consequence, it becomes possible to provide a highly integrated magnetic storage memory device capable of reading data at high speeds while reducing power consumption.

As has been described above, the magnetic element incorporating the principles of the present invention is capable of obtaining an increased magnetoresistance ratio due to the spin accumulation effect. In addition, with the memory cell elements of this invention, it is possible to reduce the total requisite number of semiconductor transistors for use as cell selectors, thereby enabling accomplishment of higher integration densities. Furthermore, in accordance with the magnetic head of the invention, it is possible to readily obtain greater magnetoresistance ratio in the presence of small magnetic fields. This in turn enables provision of a magnetic head of high sensitivities while simultaneously devoting to size miniaturization or "downsizing" and also to the quest for higher performance of magnetic disk storage apparatus with the magnetic head built therein.

Wherein the present invention has been particularly shown and described with reference to preferred embodiments thereof, it will be understood by those skilled in the art that various other changes in the form and details may be made therein without departing from the spirit and scope of the invention.

What is claimed is:

1. A magnetic element comprising:

first and second ferromagnetic layers; and a layer having semiconductor particles, disposed adjacent to the first ferromagnetic layer with a first tunnel barrier therebetween, and disposed adjacent to the second ferromagnetic layer with a second tunnel barrier therebetween, the first and second tunnel barriers have respective conductance different from each other.

2. The magnetic element of claim 1, wherein the semiconductor particles have longer electron spin relaxation time than electron tunnel time of the first and second tunnel barriers.

3. The magnetic element of claim 1, wherein the semiconductor particles have small average size enough to permit creation of single electron charging effect.

4. The magnetic element of claim 1, further comprising an electrode disposed adjacent to the layer having the semiconductor particles with a dielectric layer disposed therebetween.

5. The magnetic element of claim 1, wherein the first and second tunnel barriers are different from each other in an average film thickness or material.

6. The magnetic element of claim 1, wherein said semiconductor particles comprise ferromagnetic semiconductor particles.

7. A magnetic element comprising:

a ferromagnetic layer;

a nonmagnetic layer; and a layer having ferromagnetic semiconductor particles, disposed adjacent to the ferromagnetic layer with a first tunnel barrier therebetween, and disposed adjacent to the nonmagnetic layer with a second tunnel barrier therebetween, the first and second tunnel barriers have respective conductance different from each other.

8. The magnetic element of claim 7, wherein the ferromagnetic semiconductor particles have longer average electron spin relaxation time than the electron tunnel time of the first and second tunnel barriers.

9. The magnetic element of claim 7, wherein the ferromagnetic semiconductor particles have small average size enough to permit creation of the single electron charging.

10. The magnetic element of claim 7, further comprising an electrode disposed adjacent to the layer having the ferromagnetic semiconductor particles with a dielectric layer disposed therebetween.

11. The magnetic element of claim 7, wherein the first and second tunnel barriers are different from each other in film thickness or material.

12. A magnetic memory device comprising:

an array of magnetic storage cells; each cell including first and second ferromagnetic layers, and a layer having semiconductor particles, disposed adjacent to the first ferromagnetic layer with a first tunnel barrier disposed therebetween, and disposed adjacent to the second ferromagnetic layer with a second tunnel barrier disposed therebetween, the first and second tunnel barriers have respective conductance different from each other.

13. The magnetic memory device of claim 12, wherein the semiconductor particles have longer electron spin relaxation time than electron tunnel time of the first and second tunnel barriers.

14. The magnetic memory device of claim 12, wherein the semiconductor particles have small average size enough to permit creation of a single electron charge effect.

15. The magnetic memory device of claim 12, further comprising an electrode disposed adjacent to the layer having the semiconductor particles with a dielectric layer disposed therebetween.

16. The magnetic memory device of claim 12, wherein the first and second tunnel barriers are different from each other in an average film thickness or material.

17. The magnetic memory device of claim 12, wherein said semiconductor particles comprise ferromagnetic semiconductor particles.

18. A magnetic memory device comprising:

an array of magnetic storage cells; each cell including a ferromagnetic layer, a nonmagnetic layer, and a layer having ferromagnetic semiconductor particles, the layer having ferromagnetic semiconductor particles disposed adjacent to the ferromagnetic layer with a first tunnel barrier therebetween and to the nonmagnetic layer with a second tunnel barrier therebetween, the first and second tunnel barriers have respective conductance different from each other.

19. The magnetic memory device of claim 18, wherein the ferromagnetic semiconductor particles have longer average electron spin relaxation time than the electron tunnel time of the first and second tunnel barriers.

20. The magnetic memory device of claim 18, wherein the ferromagnetic semiconductor particles have small average size enough to permit creation of the single electron charging.

21. The magnetic memory device of claim 18, further comprising an electrode disposed adjacent to the layer having the ferromagnetic semiconductor particles with a dielectric layer disposed therebetween.

22. The magnetic memory device of claim 12, wherein the first and second tunnel barriers are different from each other in film thickness or material.

23. A magnetic read head comprising:

first and second ferromagnetic layers; and alayer having semiconductor particles, disposed adjacent to the first ferromagnetic layer with a first tunnel barrier therebetween, and disposed adjacent to the second ferromagnetic layer with a second tunnel barrier therebetween, the first and second tunnel barriers have respective conductance different from each other.

24. The magnetic read head of claim 23, wherein said semiconductor particles comprise ferromagnetic semiconductor particles.

25. A magnetic read head comprising:

a ferromagnetic layer;

a nonmagnetic layer; and a layer having ferromagnetic semiconductor particles, disposed adjacent to the ferromagnetic layer with a first tunnel barrier therebetween, and disposed adjacent to the nonmagnetic layer with a second tunnel barrier therebetween, the first and second tunnel barriers have respective conductance different from each other.

26. A magnetic storage device comprising:

a magnetic reading head including first and second ferromagnetic layers, and a layer having semiconductor particles, the layer having the semiconductor particles disposed adjacent to the first ferromagnetic layer with a first tunnel barrier therebetween and to the second ferromagnetic layer with a second tunnel barrier therebetween, the first and second tunnel barriers have respective conductance different from each other.

27. The magnetic storage device of claim 26, wherein said semiconductor particles comprise ferromagnetic semiconductor particles.

28. A magnetic storage device comprising:

a magnetic reading head including a ferromagnetic layer, a nonmagnetic layer, and a layer having ferromagnetic semiconductor particles, the layer having the ferromagnetic semiconductor particles disposed adjacent to the ferromagnetic layer with a first tunnel barrier therebetween and to the nonmagnetic layer with a second tunnel barrier therebetween, the first and second tunnel barriers have respective conductance different from each other.

29. A magnetic memory device comprising:

a plurality of memory cells including spin-dependent tunneling effect elements, each of the spin-dependent tunneling effect elements having a first ferromagnetic layer, a second ferromagnetic layer, and a gate electrode inserted between the first and second ferromagnetic layers with first and second dielectric layers disposed between the layers and the gate electrode;

a data line connected in common to the first or second ferromagnetic layers of the spin-dependent tunneling effect elements; and a plurality of word lines capacitance-coupled to the gate electrodes of the memory cells different from one another, wherein cell selection of selecting one from among the plurality of memory cells as commonly connected to the data line during reading stored data therein is performed by selecting one of the word lines to cause the selected word line to change in voltage, and then letting more than one memory cell capacitance-coupled to the selected word line change in electrical resistance value.

30. The magnetic memory device of claim 29, wherein the word lines cross over the data line.

31. The magnetic memory device of claim 29, wherein the first ferromagnetic layer, the first dielectric layer, the gate electrode, the second dielectric layer, and the second ferromagnetic layer are laminated in this order of sequence, the second dielectric layer includes a first region with the second ferromagnetic layer formed therein and a second region with the second ferromagnetic layer being absent therein, and the word line is laid out along the second region of the plurality of memory cells.

32. The magnetic memory device of claim 29, wherein the spin-dependent tunnel effect element exhibits two different tunnel resistance values through voltage change of the word line, the values defining a ratio of at least one thousand times.

33. The magnetic memory device of claim 29, wherein the gate electrode is a granular magnetic film having ferromagnetic fine particles with coercivity as dispersed within a dielectric matrix.

34. The magnetic memory device of claim 29, wherein the gate electrode is a granular film having nonmagnetic particles or semiconductor particles, the nonmagnetic particles or the semiconductor particles are dispersed in a dielectric matrix, and an electron spin relaxation time of the nonmagnetic particles or the semiconductor particles is longer than an electron tunnel time of the first and second tunnel barriers.

35. The magnetic memory device of claim 29, wherein the gate electrode contains metallic or semiconductor particles with a quantum resonance energy level.

* * * * *